United States Patent [19]

Goodwin et al.

[11] Patent Number: 5,324,155
[45] Date of Patent: * Jun. 28, 1994

[54] WAFER HANDLING SYSTEM WITH BERNOULLI PICK-UP

[75] Inventors: Dennis L. Goodwin, Tempe; Richard Crabb, Mesa; McDonald Robinson, Paradise Valley; Armand P. Ferro, Scottsdale, all of Ariz.

[73] Assignee: Advanced Semiconductor Materials America, Inc., Phoenix, Ariz.

[*] Notice: The portion of the term of this patent subsequent to Jan. 14, 2009 has been disclaimed.

[21] Appl. No.: 819,098

[22] Filed: Jan. 9, 1992

Related U.S. Application Data

[63] Continuation of Ser. No. 547,463, Jul. 2, 1990, Pat. No. 5,080,549, which is a continuation of Ser. No. 48,630, May 11, 1987, abandoned.

[51] Int. Cl.$^5$ .............................................. B65H 5/08
[52] U.S. Cl. ................................. 414/225; 414/744.5; 294/64.3
[58] Field of Search ............... 414/676, 729, 737, 751, 414/744.2–744.5, 744.8, 225, 222; 294/64.3

[56] References Cited

U.S. PATENT DOCUMENTS

| | | | |
|---|---|---|---|
| 3,539,216 | 11/1970 | Forcier | 294/64.3 |
| 4,029,351 | 6/1977 | Apgar et al. | 294/64.3 |
| 4,440,553 | 4/1984 | Helmus et al. | 55/126 |
| 4,553,069 | 11/1985 | Purser | 315/111.81 |

OTHER PUBLICATIONS

IBM Technical Bulletin, vol. 22, No. 5, Oct. 1979, Balder et al., class 294, subclass 64.3.

Primary Examiner—Michael S. Huppert
Assistant Examiner—Donald W. Underwood
Attorney, Agent, or Firm—Knobbe, Martens, Olson & Bear

[57] ABSTRACT

An improved wafer handling system including a pair of robot arms each having a drive apparatus operatively coupled to its rear end portion for extending, retracting, and rotatably positioning the robot arms. The opposite end of the robot arms are operatively connected to a pick-up wand. The pick-up wand includes a top plate and a bottom plate. The lower surface of the top plate has a plurality of commonly-connected grooves ground therein and a reservoir for supplying gas to said grooves from the forward end portion of the robot arms. A plurality of gas outlets are provided in the bottom plate, and the bottom surface of the top plate is positioned securely over and flush against the top surface of the bottom plate such that at least one of the grooves are over each of the plurality of gas outlets for delivering gas thereto. The outlets are slanted for substantially radially outwardly directing a flow of gas away from the pattern and over the top surface of the water for creating an area of relatively low pressure between the bottom surface of the lower pick-up plate and the top surface of the wafer (with respect to the pressure existing beneath the wafer) for picking up or lifting the wafer without physical contact between the wafer and the wand in the actual pick-up by utilizing Bernoulli's Principle.

15 Claims, 10 Drawing Sheets

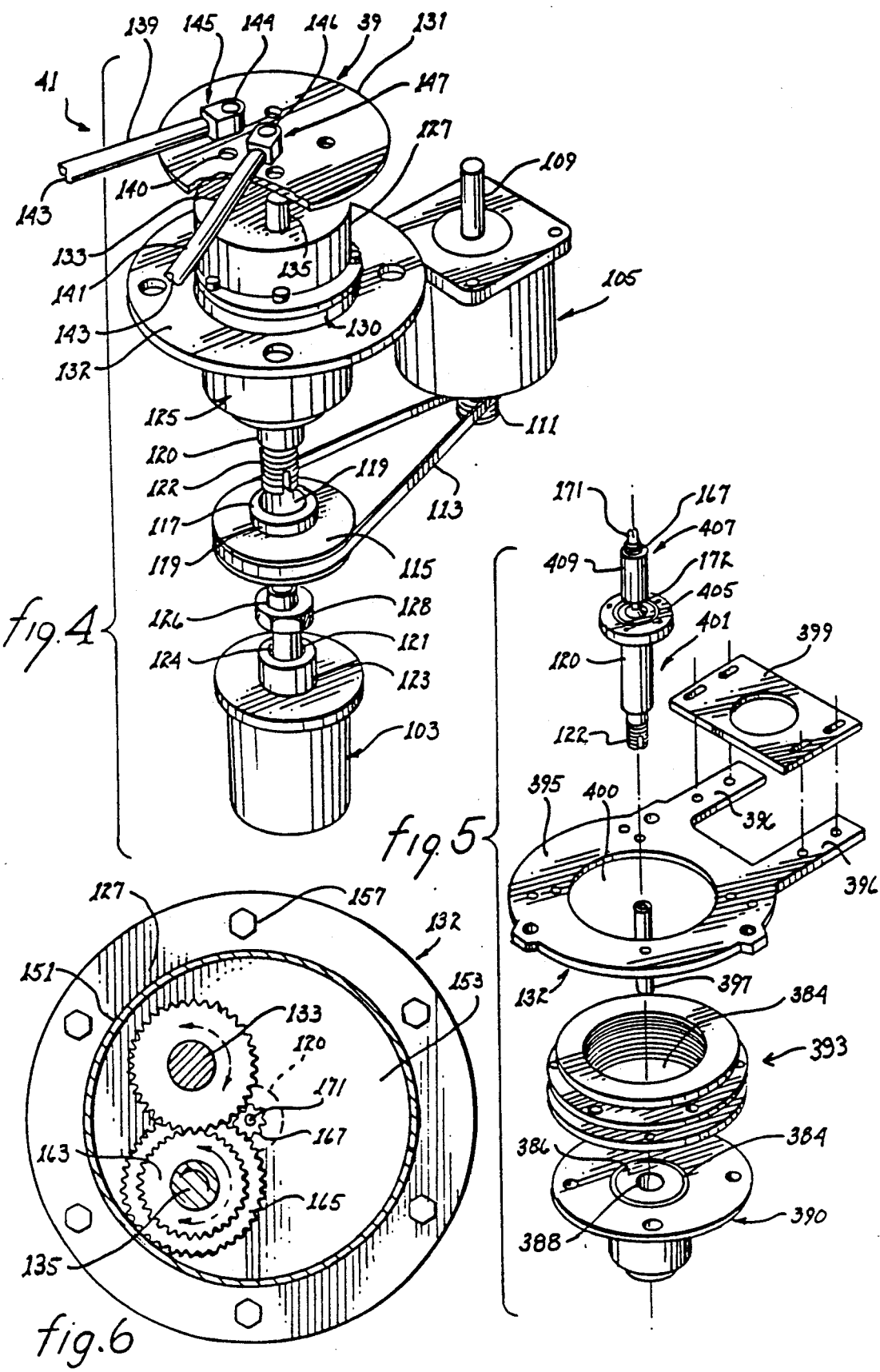

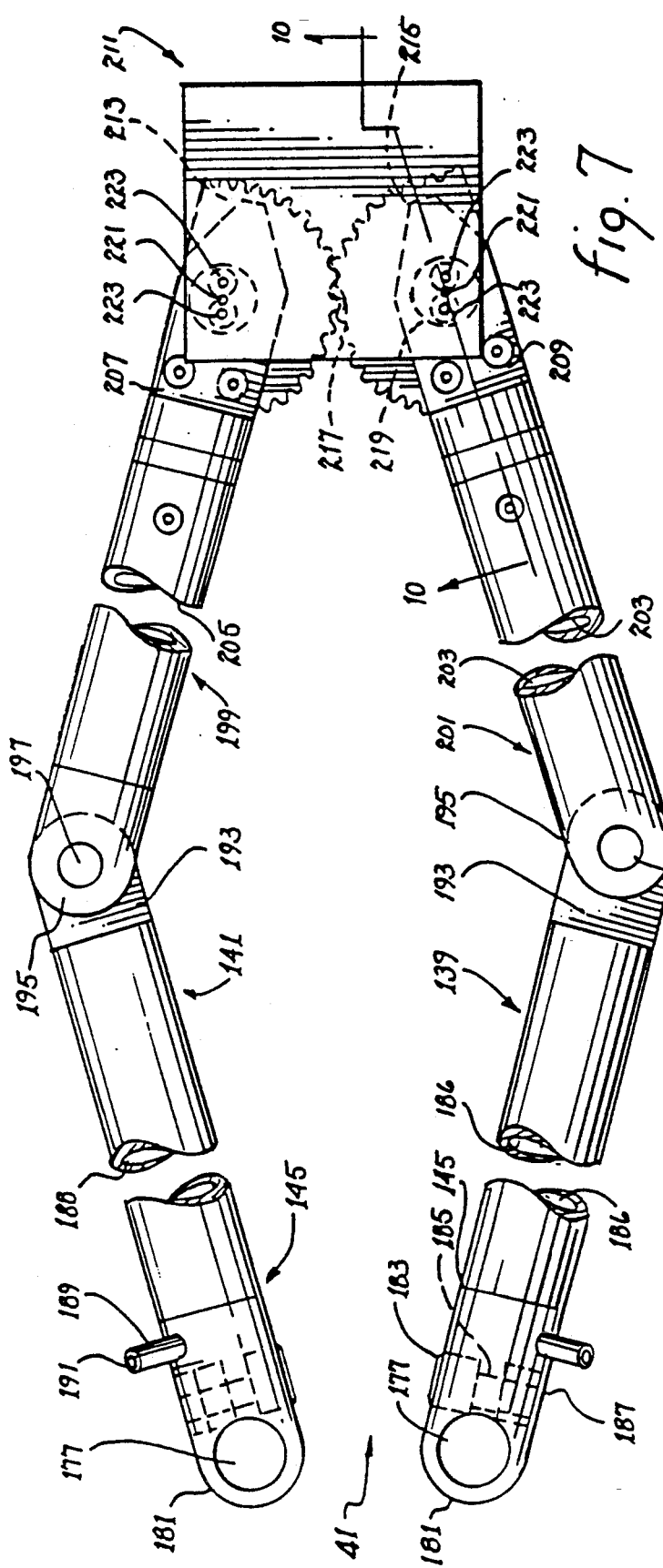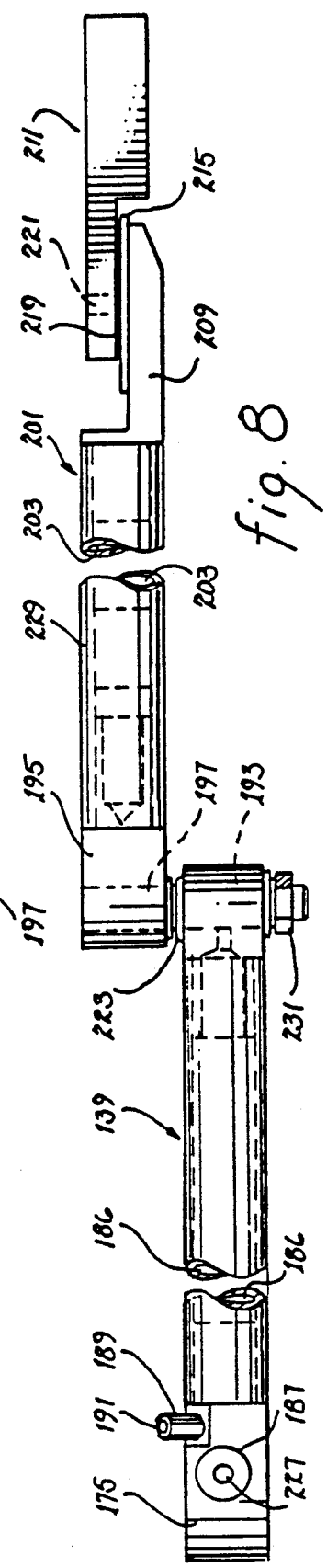

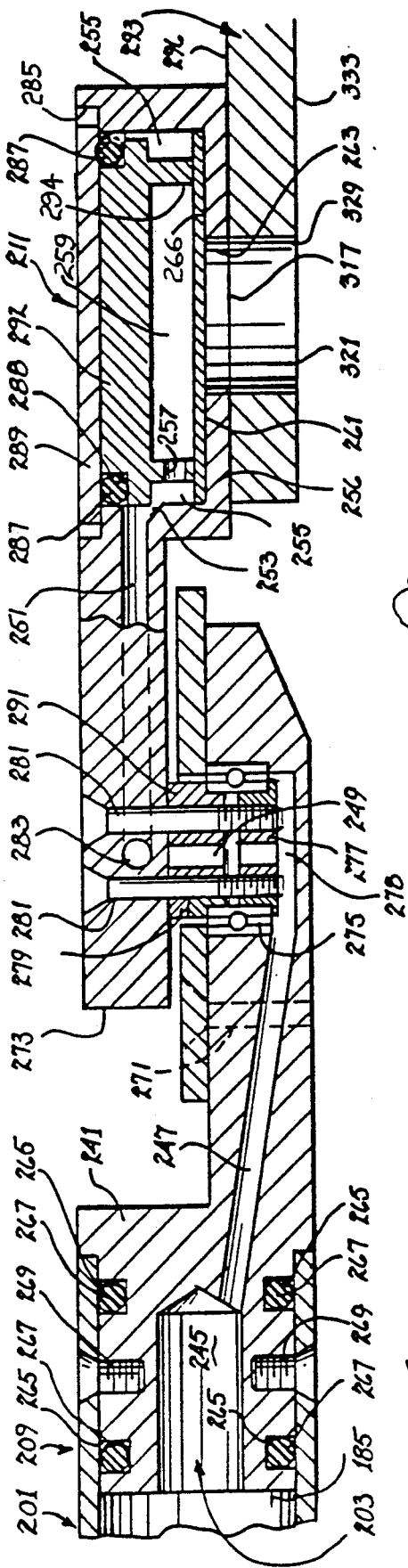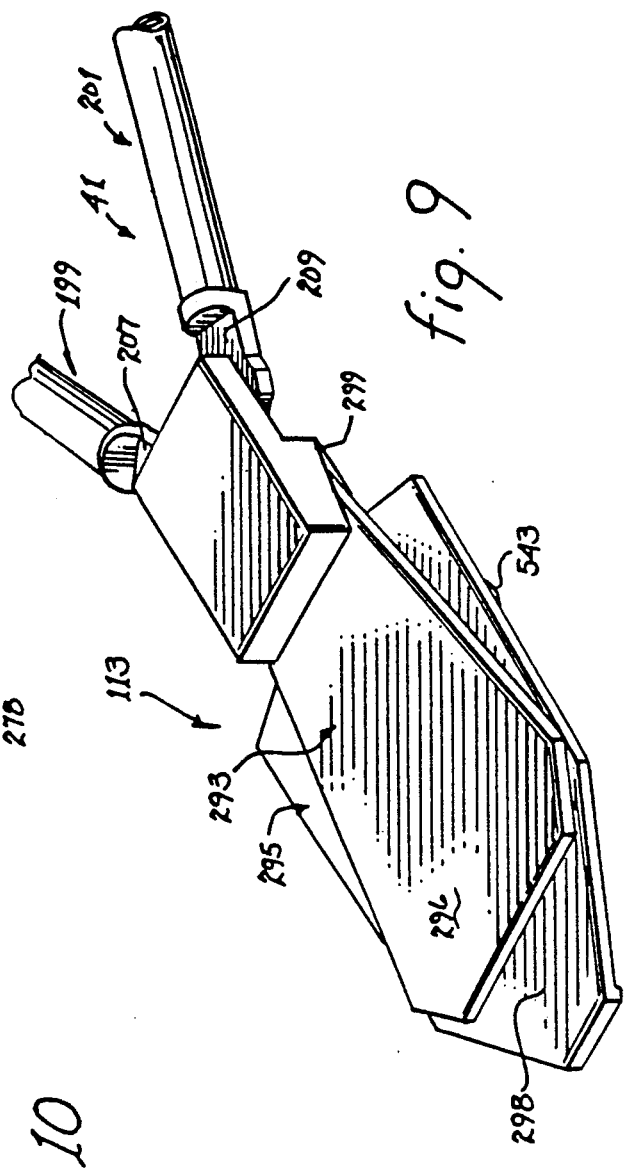

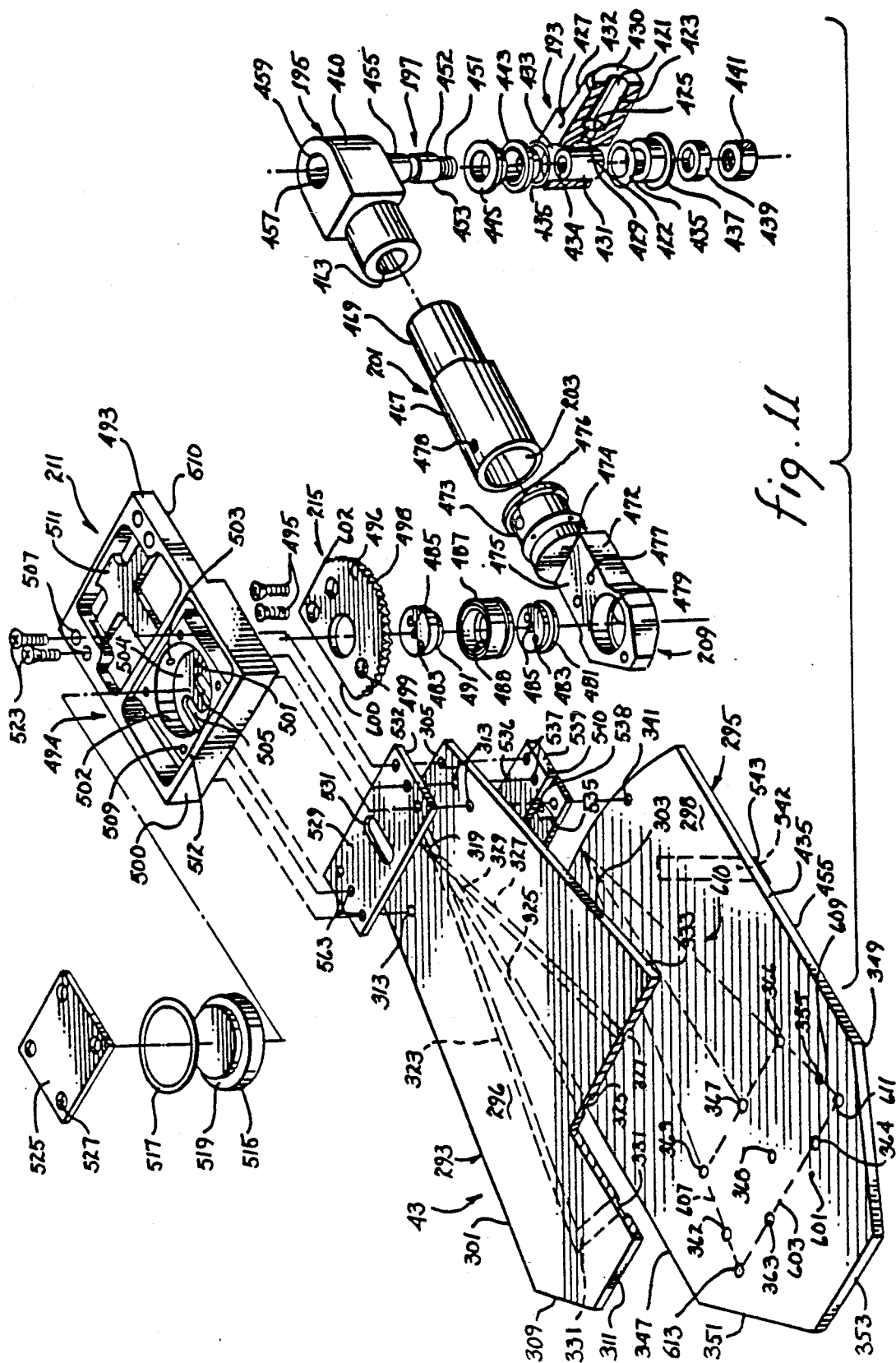

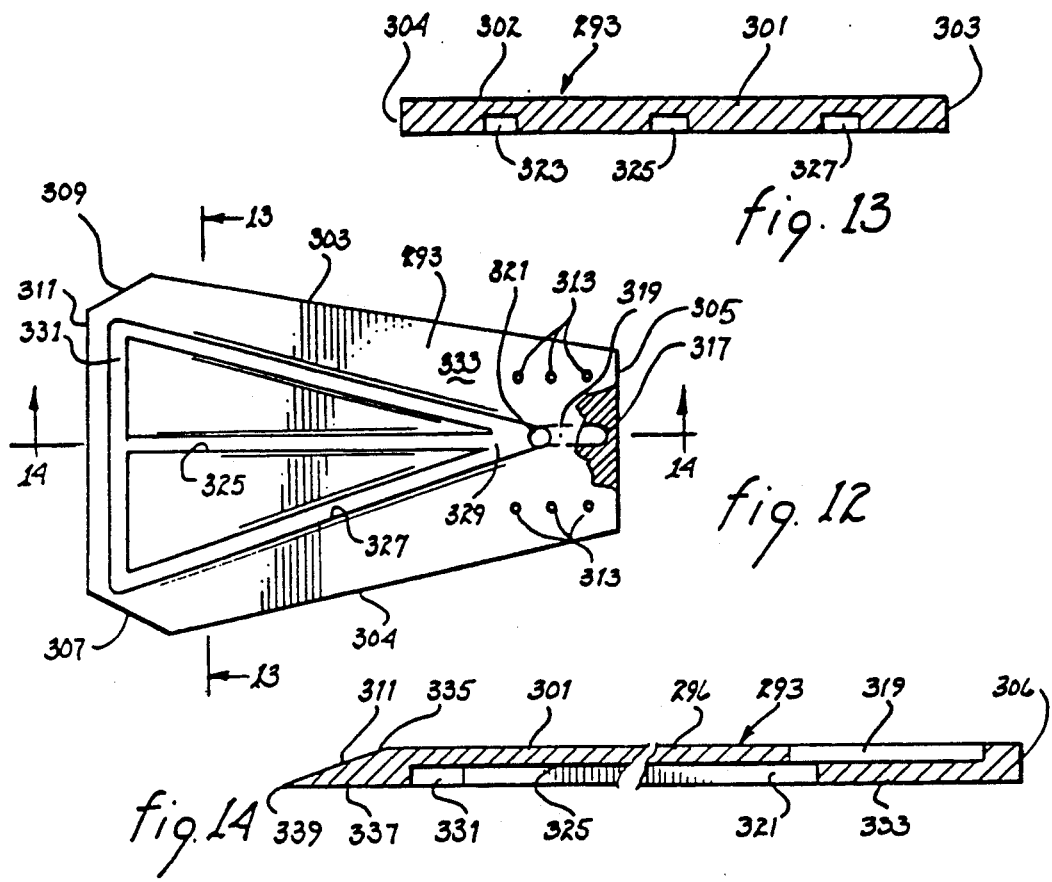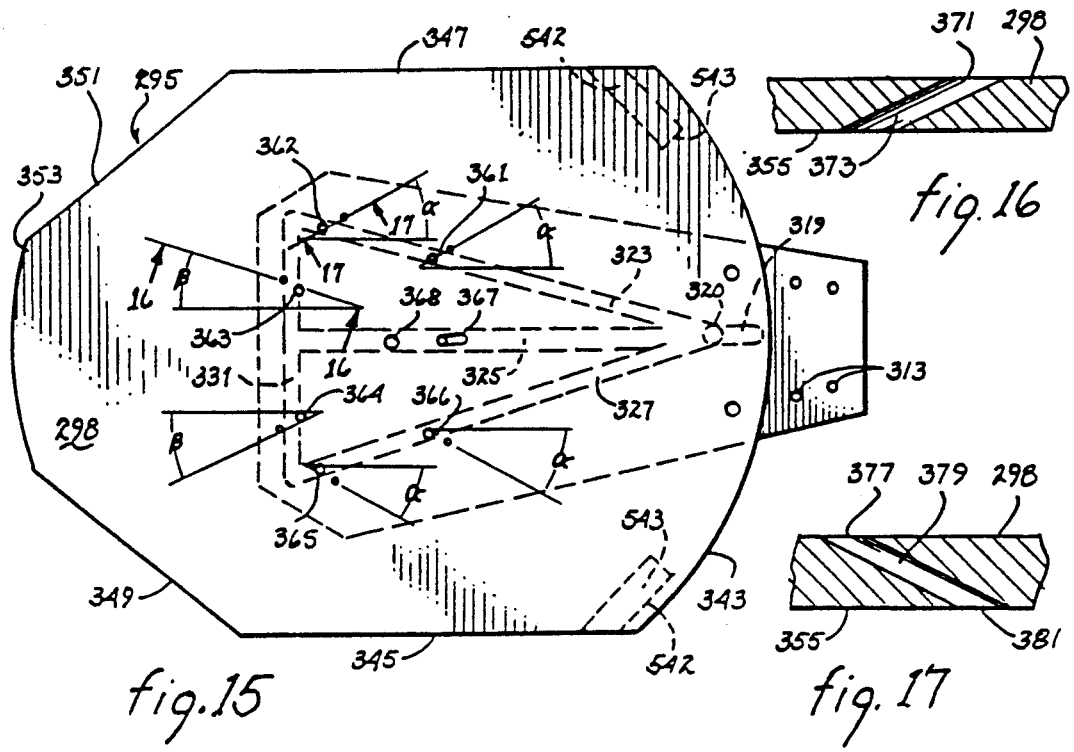

WAFER HANDLING SYSTEM WITH BERNOULLI PICK-UP

This is a continuation application of a copending application entitled "WAFER HANDLING SYSTEM WITH BERNOULLI PICK-UP", filed Jul. 2, 1990, assigned Ser. No. 07/547,463, now U.S. Pat. No. 5,080,549, which application is a continuation application of a patent application filed May 11, 1987 and assigned Ser. No. 07/048,630, now abandoned.

BACKGROUND OF THE INVENTION

1. Field of the Invention

This invention relates to wafer handling apparatus for use in a semiconductor processing system and, more particularly, to a pick up wand for lifting wafers without contact with the top or bottom surfaces of the wafer.

2. Description of the Prior Art

Many different types of semiconductor processing systems require the use of wafer handling systems or wafer transport mechanisms. The more widely used processing systems will be briefly described below. Chemical Vapor Deposition (CVD) is the formation of a stable compound on a heated substrate, such as a wafer, by the thermal reaction or deposition of various gaseous compounds. Epitaxial deposition is the deposition of a single crystal layer on a substrate (often of the same composition as the deposited layer), whereby the layer is an extension of the crystal structure of the substrate. Another example of CVD is generally classified as metallization wherein the processed silicon substrates have the metal connectors and the like deposited thereon. In an ion implantation process, selected ions of a desired dopant are accelerated using an electrical field and then scanned across the surface of a wafer to obtain a uniform predeposition. Batch processing systems involve the deposition of more than one substrate or wafer at a time.

In the batch processing, the wafers are carried in boats and the boats are usually loaded and unloaded as by use of tweezers, hand-held vacuum pickups and the like. Loading robots may be used to transfer multiple wafers simultaneously. While batch processing systems have been used extensively, the modern trend is toward the use of single wafer transport systems in order to process ever larger semiconductor wafers having diameters of over 30 centimeters. These larger wafers can contain many more circuits and much more complex circuits than were heretofore possible. While single wafer systems have less throughout than batch processing systems, attempts are being made to speed up the single wafer processes, to develop higher yields, to avoid problems such as particle contamination and to increase uniformity and quality.

Most known single wafer transport mechanisms can be adapted for use in various types of semiconductor processing systems. Such transport mechanisms include the following. In a gravity feed transport system, the wafers are stacked in a supply receptacle, which receptacle is supported in an elevator at an angle to vertical; the wafer within the receptacle is free to slide out and along an inclined ramp to a vacuum mandrel. A second inclined ramp is provided to permit a processed wafer to slide down the second ramp into a receiving receptacle. The disadvantages of this type of mechanism include the lack of positive feed; the material placed onto the wafer can come off on contact with the ramps; contaminating particles may be generated by the ramps; and, it may be limited to a single size wafer. Another type of semi-automatic mechanism for transporting wafers utilizes air bearings. The wafers are maintained horizontal and are transported to and from the processing area upon a cushion of air. This type of mechanism has proven to be highly unreliable and includes many moving parts subject to breakage and maintenance down time. Foreign material may enter and damage the air bearings or reduce their effectiveness. Other transport mechanisms utilize air cushion guidance devices where the problem of cleanliness of the air and of the turbulence produced by the air cushion are quite significant. The settling of airborne particles onto the top surface of the wafers is difficult to avoid in air cushion systems. Further, lateral guard rails must be used, and contact between the edges of the wafer and the guard rails occurs frequently and may result in unacceptable contamination or damage to the wafers. Finally, only one size of wafer can be handled without significant modification, and down time occurs when the wafer receptacles are being replaced manually.

Various mechanical transport systems have been used. One system uses a rotating carousel in combination of supply and receiving slides. Another system uses a belt drive transport to discharge the wafers from a supply cassette and at various other transfer points. As the cassettes are discharged successively from the bottom and loaded in reverse order, impurities often drop from the bottom of one wafer onto the top of the wafer beneath it. Additional problems arise at the transfer points because the transport motion of the wafers is terminated by stoppers which can result in previously deposited layers being spalled off or chipped off to further contaminate the wafer surfaces. Other wafer handling systems utilize a spatula or shovel type pickup to slide under the wafers or move under the wafers and come up through the cassette track spaces to pick up the wafers and carry them to the next location.

An arm type system utilizes a vacuum chuck positionable under a wafer for attachment to the underside of the wafer by producing a vacuum at the point of contact. The wafer is lifted out of the cassette and carried to a processing station or the like; this system cannot place a wafer on a flat continuous surface. Damage often results from the mechanical contact between the vacuum chuck and the wafer.

In summary, the trend of the prior art is toward single wafer processing systems. A key factor in automating such systems lies in improving the wafer transport mechanism. Furthermore, the critical problems presented by particle contamination become ever more important as wafers become larger and larger and as circuits become more and more complex. None of the known systems are sufficiently clean to enable their use in a completely automated processing system, nor do they avoid touching the top and/or bottom surfaces of the wafer.

SUMMARY OF THE INVENTION

A pick up wand assembly of the present invention utilizes the Bernoulli Principle for effecting a contactless pickup or lifting of the wafer. The wand assembly is mounted at the front of a robot arm, which arm includes passageways for receiving and distributing a gas to the pick up wand assembly. A plurality of gas outlets in a bottom plate of the pick up wand assembly produces an area of relatively low pressure between the top surface of the wafer and the bottom surface of the pick up wand assembly (with respect to the pressure existing beneath the wafer) for lifting the wafer without physical contact between the wafer and the pick up wand assembly. The plurality of gas outlets are oriented or slanted substantially radially outward from a central portion of a geometric pattern to produce an outward gas flow across the top surface of the wafer to be picked up. The gas flow: (1) establishes a zone of relatively low pressure between the bottom plate and the top surface of the wafer (relative to the pressure normally existing beneath the lower surface of the wafer) to enable a pickup from above the wafer without any physical contact between the wafer and the bottom plate; (2) provides a continuous outward sweeping action which sweeps the top surface of the wafer free of particles which might otherwise accumulate; (3) provides a uniform gap between the bottom plate and the top surface of the wafer; (4) exerts a soft gentle horizontal force on the wafer for moving it toward stops; and (5) avoids abrasion and damage to the wafer.

A primary object of the present invention is to provide a wafer transport mechanism employing a wafer pick up wand utilizing the Bernoulli Principle.

Another object of the present invention is to provide a wafer handling system utilizing a pick up wand for lifting a wafer without physical contact therebetween.

Yet another object of the present invention is to provide a wafer transport mechanism which greatly reduces particulate generation.

Still another object of this invention is to protect the top surface of a wafer from particulate contamination during pickup, transport and drop off.

A further object of this invention is to provide a pattern of gas outlets on the bottom of a pick up wand for substantially, radially outwardly, directing the gas flow to provide for the creation of a low pressure area between the lower surface of the pick up wand and the upper surface of the wafer to enable the wafer to be picked up from above and without physical contact therewith while simultaneously providing an outward flow of air, which flow continually sweeps the surface of the wafer to prevent contamination from particles.

A further object of the present invention is to provide a pick up wand which, by means of a particular pattern of outwardly oriented gas outlets, creates an outward gas flow at all points on the wafer perimeter to avoid drawing in particulate contaminants from the surroundings onto the wafer while creating a force to lift the water.

These and other objects of the invention will become apparent to those skilled in the art as the description thereof proceeds.

BRIEF DESCRIPTION OF THE DRAWINGS

FIG. 4 is an assembly drawing of the drive system;

FIG. 5 is an assembly drawing of the fluidic drive portion of the drive system shown in FIG. 4;

FIG. 6 is a sectional top view of the gear drive portion of the drive system shown in FIG. 4;

FIG. 7 is a top view of the robot arms shown in FIG. 1;

FIG. 8 is a side view of one of the robot arms shown in FIG. 7;

FIG. 9 is a perspective view of the pick up wand assembly shown in FIG. 1;

FIG. 10 is a sectional side view of the front end of the robot arms shown in FIG. 9.

FIG. 11 is an assembly drawing illustrating the front end of the robot arms the pick up wand assembly shown in FIG. 9;

FIG. 12 is a bottom view of the gas distribution plate shown in FIG. 9;

FIG. 13 is a sectional end view of the gas distribution plate shown in FIG. 12;

FIG. 14 is a sectional side view of the gas distribution plate shown in FIG. 12;

FIG. 15 is a top plan view of the plate shown in FIG. 9;

FIG. 16 is a sectional side view of one of the gas outlets shown in FIG. 15;

FIG. 17 is a sectional side view of a gas outlet shown in FIG. 15;

DESCRIPTION OF THE PREFERRED EMBODIMENTS

The wafer transport mechanism described herein may be used in an epitaxial deposition system, but it can be used in other types of semiconductor processing systems.

Figure 1:
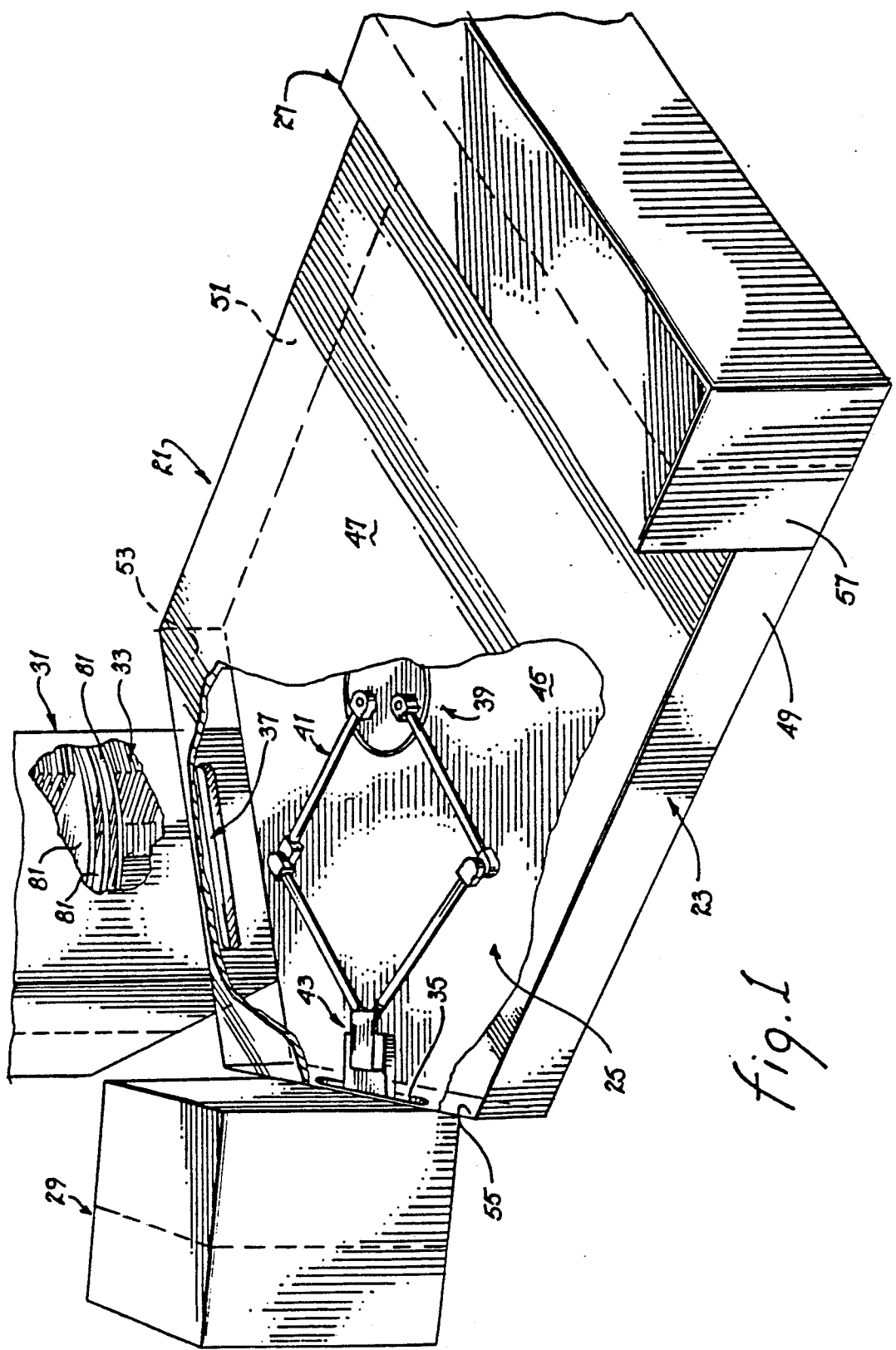
FIG. 1 is a perspective view of the wafer transport mechanism of the present invention as utilized in a semiconductor processing system.
Figure 2:
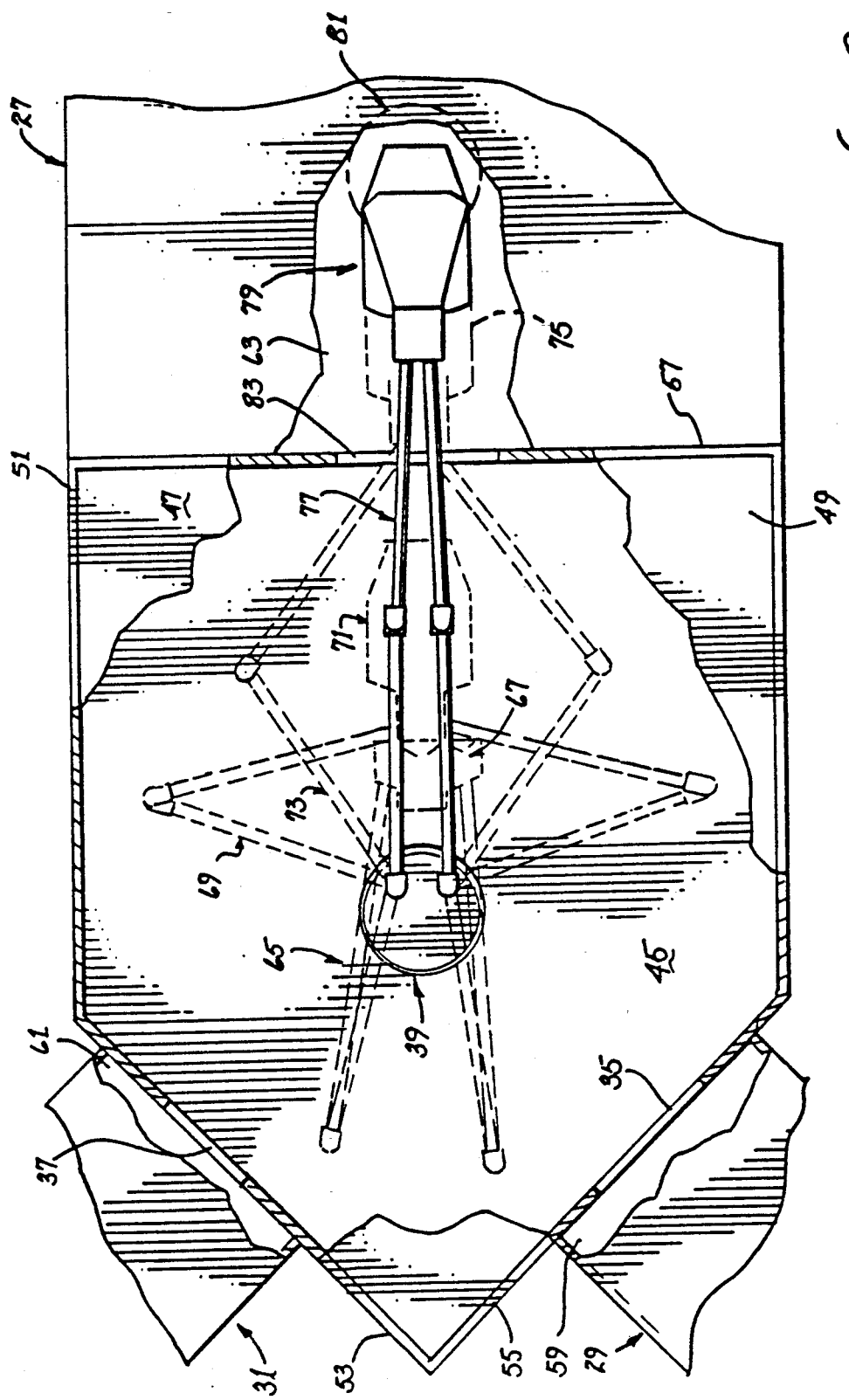
FIG. 2 is a partially sectional top plan view of the wafer transport mechanism shown in FIG. 1.

Referring to FIGS. 1 and 2, substrate transport mechanism 21 includes a laminar flow envelope or enclosure 23 having a substantially hollow interior 25. Preferably, the enclosure is made of a non-contaminating material, such as anodized aluminum. The epitaxial deposition system in which substrate transport mechanism 21 is usable includes a reactor oven, reaction chamber, or reactor 27 having an access slot 83 to provide communications between hollow interior 25 with hollow interior 63 of the reactor. A gate valve (not shown) is provided for selectably opening or sealably closing access slot 83.

The epitaxial deposition system includes at least two purge boxes or stations 29, 31 for supplying wafers 81 to be processed and for storing the wafers after they are processed, respectively. Each of the stations 29, 31 includes a hollow interior and one of access slots 35, 37, respectively, for communication with enclosure 23. Each of the stations 29, 31 also includes a cassette 33 which sits on an indexing elevator. Each cassette includes a plurality of vertically stacked tracks for horizontally supporting the substrates or wafers on their outermost peripheral edges. Each wafer may be a six inch circular silicon wafer which is to have additional silicon deposited thereon. Each station 29, 31 also has an access door (not shown) on the side opposite the respective slot for human operator access to load and unload the cassettes.

The specific structures of stations 29, 31, cassettes, wafers, elevators, elevator indexing mechanisms, purging system and the like, are not critical to an understanding of the present invention and will not be described in any greater detail.

An arm mounting plate assembly 39 is disposed in a central recess in floor 45 of enclosure 23 and is used to operatively mount the rear end of a pair of robot arms 41 thereto. The combination of plate assembly 39 and individual shaft drives to the rear ends of robot arms 41 enables the robot arms to be extended and retracted toward and away from the plate assembly and to be angularly repositioned from location to location, such as from station 29 to reactor 27, or the like. A pick up wand assembly 43 is operatively mounted to the front end of robot arms 41 for actually picking up or lifting wafers 81 for transport purposes.

Enclosure 23 includes a floor 45, a top surface 47, a first longitudinal side 49, a second longitudinal side 51, a first end side 53, a second end side 55, and a rear end side 57. Plate assembly 39, together with articulated robot arms 41 and the wand assembly 43, are all housed within the hollow interior of enclosure 23. Plate assembly 39 is mounted in a recess in floor 45 and driven by a drive assembly which is vacuum-sealed on the opposite side of the floor, as hereinafter described. Hollow interior 25 is adapted to provide a controlled clean atmosphere and the atmosphere is preferably one of hydrogen, nitrogen or argon.

FIG. 2 particularly illustrates robot arms 41 in various positions of extension and retraction from plate assembly 39. In a first position, the robot arms are designated by the reference numeral 65 and the wand assembly by reference numeral 67. In this position, wand assembly 67 is at its closest position to plate assembly 39 and this is referred to as the home position since it is only in this position that the plate assembly rotates to rotatably position the wand assembly from location to location. Reference numeral 69 illustrates the robot arms in a second position that the wand assembly 71 would occupy. A third position is indicated by reference numeral 73 which positions wand assembly 75 just inside of access slot 83 of reactor 27. Lastly, robot arm position 77 shows the pair of robot arms fully extended to position wand assembly 79 within hollow interior 63 of reactor 27 and over the susceptor for delivering wafer 81 thereto.

Figure 3A:
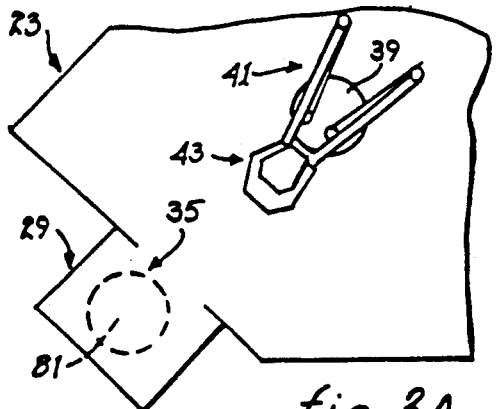
FIGS. 3A-3P show a series of illustrations depicting the movements of the robot arms shown in FIG. 1.
Figure 3E:
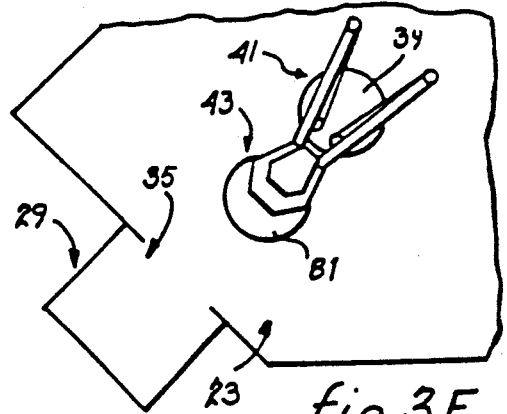
Figure 3B:
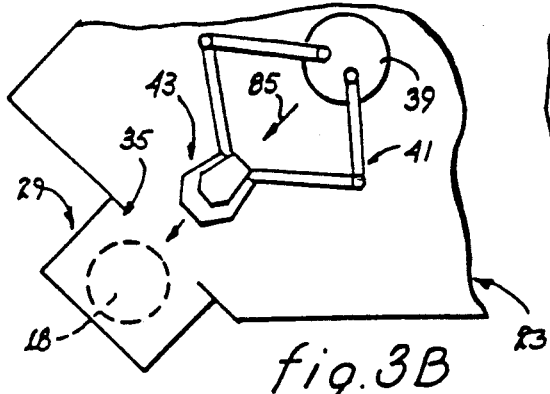
Figure 3F:
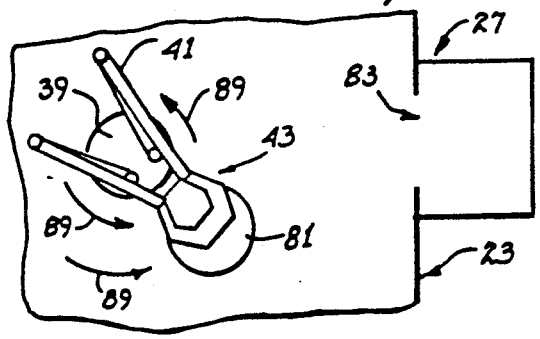
Figure 3C:
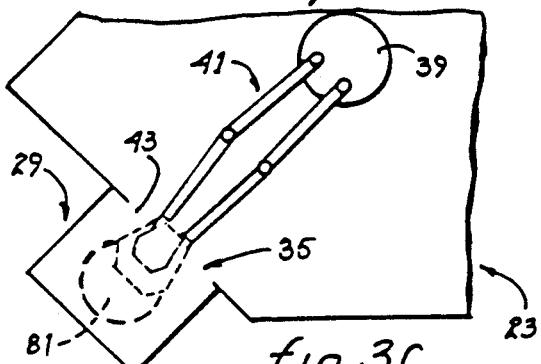
Figure 3G:
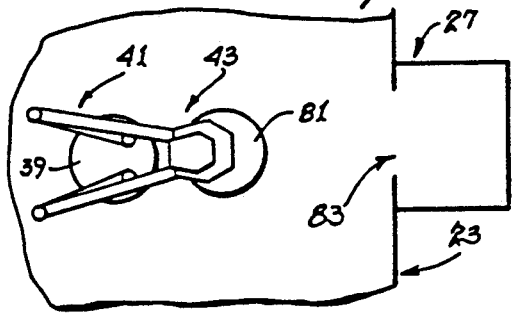
Figure 3D:
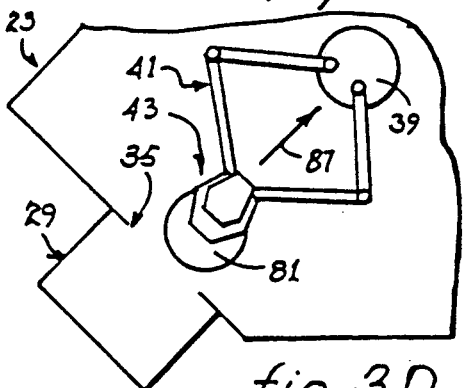
Figure 3H:
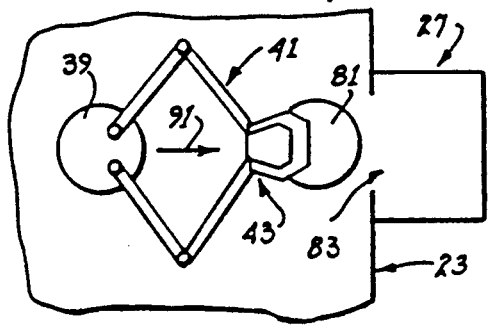
Figure 3I:
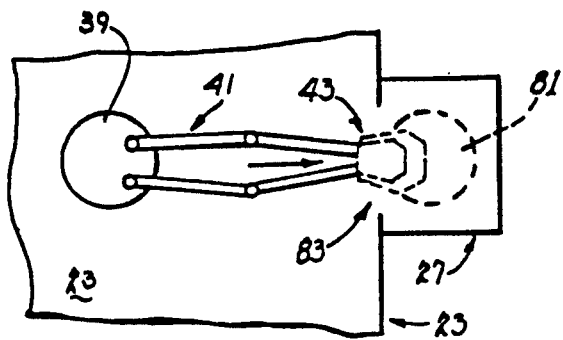
Figure 3M:
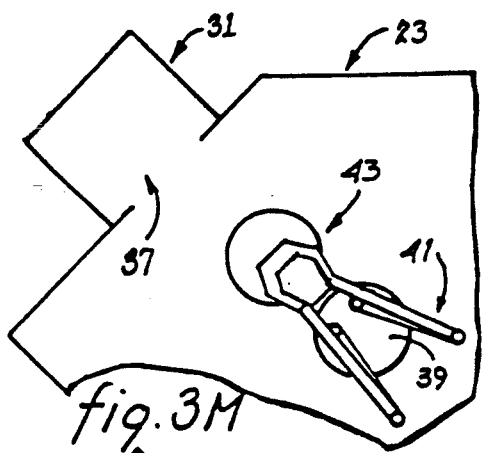
Figure 3J:
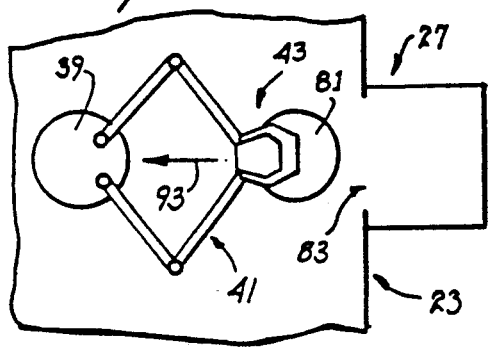
Figure 3N:
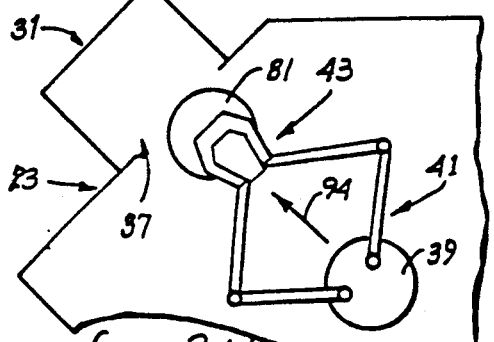
Figure 3K:
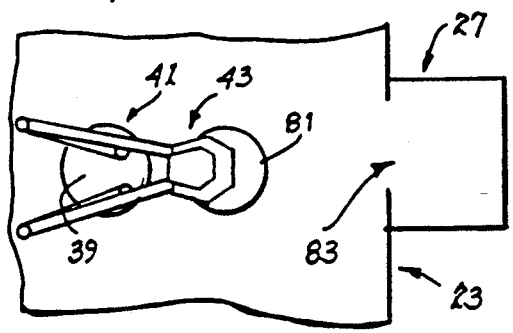
Figure 3O:
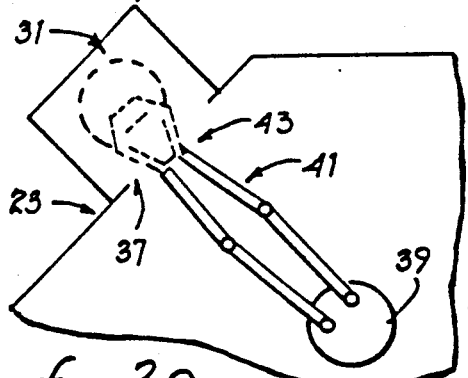
Figure 3L:
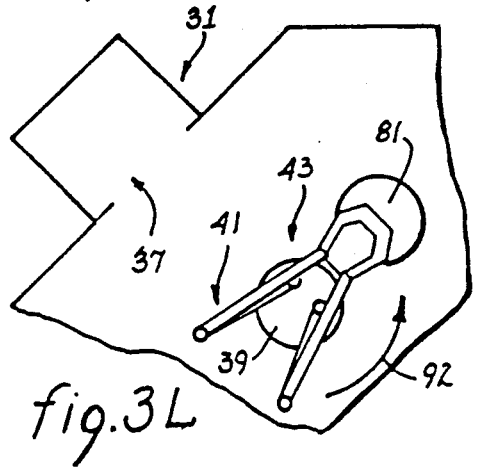
Figure 3P:
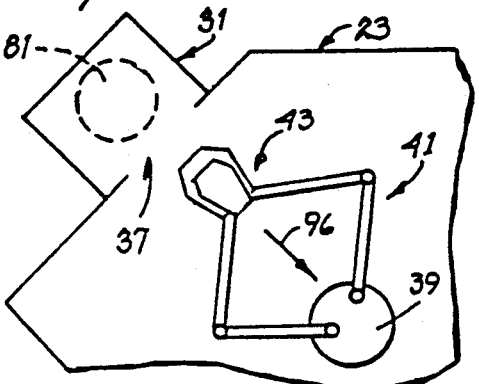

FIGS. 3A-3P illustrate the various positions of robot arms 41 with respect to wand assembly 43 and plate assembly 39. In each of these figures, a portion of enclosure 23 will be shown with at least one of stations 29, 31 or reactor 27. Directional arrows are provided to show either the direction of extension, the direction of retraction, or the direction of rotation during any one step, as represented by the individual figures.

In FIG. 3A, robot arms 41 are shown in their home position with wand assembly 43, facing station 29 and containing at least one wafer 81 to be picked up. In FIG. 3B, robot arms 41 have begun to extend away from plate assembly 39 and toward wafer 81. Directional arrow 85 shows the linear direction of movement during the wafer pick up operation. FIG. 3C shows robot arms 41 in their fully extended position with wand assembly 43 positioned through access slot 35 and into purge box 29 for picking up wafer 81 from a cassette on an elevator housed therein. FIG. 3D shows robot arms 41 in an intermediate position of retraction (as indicated by the directional arrow 87) after pick up of wafer 81, toward the home position shown in FIG. 3E. In FIG. 3E, robot arms 41 are again in the home position and ready for the rotational movement indicated by the rotational direction arrow 89 shown in FIG. 3F. In this position, the robot arms are in the home position and plate assembly 39 is rotated counterclockwise from station 29 toward the reactor 27.

In FIG. 3G, robot arms 41 are still in the home position but wand assembly 43 now faces access slot 83 of reactor 27. In FIG. 3H, the robot arms are again shown in an intermediate position while moving wafer 81 toward reactor 27, as indicated by directional arrow 91 showing the linear direction of movement from this position. FIG. 3I shows robot arms 41 in a fully-extended position such that wand assembly 43 can position or deposit wafer 81 onto the susceptor within reactor 27. FIG. 3J shows robot arms 41 at an intermediate position of retraction, as indicated by the directional arrow 93 and FIG. 3K shows the robot arms returned to their home position.

In FIG. 3L, plate assembly 39 again rotates counterclockwise, as indicated by directional arrow 92, to rotationally reposition wand assembly 43 and processed wafer 81 from reactor 27 and toward the access slot 37 of station 31. In FIG. 3M, robot arms 41 are in the home position with wand assembly 43 facing access slot 37 of station 31. In FIG. 3N, the robot arms are shown in an intermediate position as they move toward access slot 37 of station 31, as indicated by directional arrow 94. In FIG. 3O, the robot arms are fully extended into station 31 to deposit wafer 81 on the tracks of a cassette located therein. In FIG. 3P, the robot arms are shown in an intermediate retracted position as they once again return to the home position shown in FIG. 3M, as reflected by directional arrow 96.

FIG. 4 illustrates drive assembly 101 for extending and retracting robot arms 41 and rotating plate assembly 39. Rotatable plate 131 is a generally flat, circular plate which is operatively disposed within a cylindrical recess (not shown) located in floor 45 of enclosure 23. A pair of screw members (not shown) pass through apertures 140, 142 and secure plate 131 to the drive mechanisms therebelow while a pair of shafts 133 and 135 extend vertically above the plane of plate 131.

Shaft 133 is adapted to engage an aperture 144 in rear end connector 145 of robot arm segment 139 while the upper end of shaft 135 engages aperture 146 of end connector 147 at the rear end of second robot arm segment 141. Each of the lower robot arm segments is shown as being a generally elongated member having a conduit 143 for gas flow therethrough.

Drive assembly 101 includes a shaft drive motor 103 which is a conventional DC, digital, micro-stepping motor (such as Model No. M062-FC03E manufactured by Superior Electric Co. of Bristol, Conn.). Robot arm drive motor 105 is a digital DC micro-stepping motor (such as Model No. M092-FC08E manufactured by the Superior Electric Co. of Bristol, Conn.). Drive motor 103, which is used for the extension and retraction of robot arms 41, drives a flex shaft coupler, 124 (397 FIG. 5) which drives the ferrofluidic feedthru 409 which has a gear 167 and collar 171 attached to the gear box end (FIG. 6) of the feedthru shaft. Gear 167 then drives gear 165 (shaft assembly 135) which through shaft 135 drives gear 163 which then drives countershaft 133 by way of gear 161 in the opposite direction of shaft 135. Drive motor 105, which is used for the rotation of robot arms 41 and having a shaft 109 which has a drive pulley 111 mounted to it, drives belt 113 which drives pulley 115. Pulley 115 is attached to drive tube 122 which has motor 103, flange 123 mounted on the bottom and feedthru 409 and the gear box assembly (FIG. 6) mounted on the other (top) end. This drive tube is then mounted in the hollow shaft of feedthru 125. Pulley 115 has a collar 117 extending from the top surface; a channel 119 passes through the collar and the pulley. Drive shaft 121 of drive motor 103 (extension, retraction motor) extends vertically upwardly therefrom through internally-threaded collar 123 disposed on the upper surface of the housing of drive motor 103, a nut 128, channel 119, collar 117, through the interior of a vertically downwardly extending tubular stem 120 having an externally-threaded end portion 122 and into ferrofluidic drive housing 125 connecting to 409 (FIG. 5).

Ferrofluidic drive housing 125 will be more extensively described with joint reference to FIGS. 5 and 6. Gear housing 127 is coupled through a vacuum seal to interior 25 of enclosure 23. Robot arms 41, via the shaft extensions 133 and 135, are driven to extend and retract via the operation of the gears cooperating with ferrofluidic drive shaft 409, 121. The rotation of plate 131 of plate assembly 39 will now be described. The externally-threaded end 122 of stem 120 is inserted through channel 119, through nut 128, and threaded into collar 123. Nut 128 can be used as an adjustment or lock nut. Once end 122 is screwed into collar 123, pulley 115 is securely clamped to stem 120 and may be pinned by a pin extending through aperture 118 of collar 117 and a corresponding aperture (not shown) in stem 120. As motor 105 drives pulley 115, stem 120, which is fixedly secured to the bottom center of housing 125, rotates housing 127 supported by bearings in feedthru 125.

Ferrofluidic base plate 390 is shown in FIG. 5 as being attached to a metal bellows assembly 393 over which is mounted plate 132. Plate 132 includes a ring 395, an aperture 400 and a pair of elongated members 396. A motor-mounting plate 399 is disposed on elongated members 396 extending from ring 395. A hollow tubular stem or ferrofluidic drive tube assembly 401 includes stem 120 and an annular flange 405. Intermediate connector 397 passes inside of the threaded end of stem 120 and the base of tube assembly 401 is operatively disposed within the hollow central drive channel 388 of base plate 390. A ferrofluidic drive shaft 172 extends from the top surface of annular flange 405, through a ferrofluidic collar 409 to a pinion gear 167 and its shaft 171 disposed in housing 127. Shaft 172, tube assembly 401 and collar 409 comprise a ferrofluidic feed-through mechanism 407 which brings about extension and retraction of robot arms 41.

The ferrofluidic drive apparatus described above is a commercially available conventional unit adapted herein to enable extension and retraction of the robot arms and rotational movement of plate assembly 39. Connector 397 passes through aperture 400 of mounting plate 132 and channel 384 of bellows assembly 393 to engage channel 388 in base plate member 390. Channel 388 is surrounded by a collar 386 that is housed within a larger channel 384. Plate 399 is disposed on elongated members 396.

Tube assembly 401 includes a shaft 403 and annular flange 405. A threaded end 404 connects connector 397 inside the threaded end of shaft 403 and the base of tube assembly 401 is operatively disposed within the channel of plate member 390. Tube assembly 401 passes shaft 171 through the top surface of annular flange 405 which is surrounded by a threaded end 411 and an outer collar 409.

FIG. 6 illustrates the gear assembly within housing 127. The gear assembly includes an outer cylindrical wall 151 mounted onto mounting plate 132. The mounting plate is attached by means of bolts 157 to the top portion of housing 125. Interior 153 of wall 151 receives drive shaft 171 from housing 125 and drives pinion gear 167. Pinion gear 167 engages with the teeth of gear 165 which gear is coupled via shaft 135 to drive gear 163. The teeth of drive gear 163 mesh with the teeth of gear 161 mounted on shaft 133. Shafts 133 and 135 each have an upper extending end which extends through the upper surface of plate 131 into enclosure 23 to engage the rear end of a corresponding one of arm segments 139 and 141, as shown in FIG. 4. In this manner, extension and retraction of the arms are accomplished by the respective rotation of shafts 133 and 135 and via the rotation of gears 161 and 163, respectively.

FIG. 7 shows robot arm 41 in greater detail. Rear end 175 of each of the pair of robot arms includes a member 181 having an aperture 177 for engaging the extending portions of shafts 133 and 135. Rear end 175 includes a hex head self-locking clamp mechanism with a head 183 having an elongated, externally-threaded stem 185 for engaging a hollow, internally-threaded retainer drum clamp 187 to tighten or loosen the grip of member 181 about respective shaft 133 or 135. Furthermore, each of rear ends 175 of arm segments 139 and 141 includes a gas inlet comprising an elongated cylindrical stem 189 and an interior channel 191 communicating with hollow interior 186 of arm segments 139, 141. Inlet channel 191 is connected to a source of gas, such as hydrogen or nitrogen.

Each intermediate portion of arm segments 139 and 141 includes a generally cylindrical wall 188 and each has a hollow interior 186 or at least a hollow interior gas-conducting passage within the hollow interior. An arm mid-connector 193 includes shaft 197 for engaging an opposing mid-connector 195 of upper arm assemblies 199 and 201, respectively. Each of the upper arm assemblies has a substantially hollow interior 203 and a cylindrical wall 205. At each end of upper arm assemblies 199 and 201 is disposed an end plate 207, 209, respectively. Each of end plates 207, 209 is connected to a Bernoulli mounting plate 211 through gear segment 213 and gear segment 215, respectively. The teeth of the gear segments mesh at a point designated by numeral 217. A retainer bushing 219 includes a gas passageway 221 and a pair of apertures 223.

FIG. 8 shows a side view of one of robot arms 41. Rear end 175 includes drum clamp 187 having a threaded internal aperture 227 extending therethrough. The rear end also includes a gas flow inlet, stem 189 having an inlet channel 191 for communicating with an external source of gas. The front end of arm segment 139 is connected via mid-connector 193 and shaft 197 to mid-connector 195; bearings 223 are retained about shaft 197 and by a nut 231.

An intermediate portion of arm assembly 201 includes a filter 229 operatively disposed within interior 203 for filtering particles from the flow of gas passing therethrough. The gas is channeled through end plate 209 and then upwardly through a bearing 219 via passageway 221 to mounting plate 211. FIG. 9 illustrates the front end of robot arms 41, mounting plate 211 and wand assembly 43. Arm assemblies 199 and 201 are coupled to mounting plate 211 via end plates 207 and 209, respectively. The wand assembly is connected to the under surface of mounting plate 211 by a wand retainer plate 299. The wand assembly includes a gas distribution plate 293 and a gas outlet plate 295 which may be referred to collectively as the head unit. Each of the plates 293 and 295 is substantially flat or planar and is adapted to have one surface mounted flush against a surface of the other. Gas distribution plate 293 has a flat upper surface 296 and gas outlet plate 295 has a flat or planar top or upper surface 298. Preferably, plates 293 and 295 are made of fused quartz and acid-etched with hydrofluoric acid to greatly reduce a tendency to produce or attract particles which might contaminate or damage the wafers.

FIG. 10 shows a sectional side view of arm assembly 201 of one of the pair of robot arms 41, including end plate 209 and mounting plate 211. Interior 203 of the robot arm includes a gas-conducting passageway which communicates with a smaller diametered cylindrical gas inlet passageway 245 in the front of end plate 209. End plate 209 includes a metal, preferably stainless steel or some similar structural material, body 241 secured within the interior walls of arm assembly 201. O-ring gaskets 267 are housed in annular slots 265 to prevent the escape of gas. Arm assembly 201 is connected to end plate 209 and body 241 of the end plate 209 via fastener 269.

A relatively narrow, cylindrical gas-conducting conduit 247 communicates with passageway 245 and a vertical gas passageway 249. Passageway 249 is surrounded by a lower retainer 277 and an upper retainer 279. A collar 291 and bearing 275 surrounds passageway 249 and are connected via threaded fasteners 281 to mounting plate 211. Another fastener 271 is used to secure gear segment 215 to body 241 of end plate 209.

The gas flows through a narrow, gas-conducting, slanted passageway 247 to horizontal gas collection chamber 278 and then flows vertically upwardly through passageway 249, through an outlet 283, and into a horizontal passageway 251 of mounting plate 211. The mounting plate includes a body 273 having a generally cylindrical recess 255 formed in the front end. Floor 266 of recess 255 includes a gas outlet aperture 263. The gas outlet aperture 263 communicates with an inlet 317 in upper surface 296 of gas distribution plate 293. Gas inlet 317 communicates through gas distribution plate 293 via channel 329 to a bottom gas outlet 321. Floor 256 of recess 255 has an annular filter 261 disposed therein for filtering particles from any gas passing therethrough via the inlet 257 and aperture 263. An annular member 292 is positioned with an annular flange 294 disposed about the outer peripheral edge portion of the filter 261. Upper shoulders of the annular member 292 contain an annular groove 288 for housing an O-ring seal 287. Annular member 292 is compressively held within recess 255 via a cover 289 secured within the opening 285 for replacing filter 261. The gas flows horizontally through the rear portion of mounting plate 211 via passage 251 and then passes downwardly through short, narrow, slanted passageway 253 into recess 255 about annular flange 294. The gas then passes through inlet 257 of the annular flange and enters into hollow central cylindrical cavity 259 from whence it passes vertically downwardly through aperture 263 to gas distribution plate 293.

FIG. 11 shows the front end portion of robot arm 41, mounting plate 211 and wand assembly 43. The connection between arm segment 139 and arm assembly 201 includes mid-connector 193, mid-connector 195 and shaft 197 therebetween. Arm segment 139 is attached to mid-connector 193. The mid-connector includes a cylindrical body 430 integral with a rectangular block 427. A sleeve 432 surrounds body 430. The cylindrical body terminates at gas inlet 421. Gas travels from the gas inlet through a cylindrical central passageway 423 to a relatively small circular gas outlet 425. Outlet 425 communicates through a narrow passageway 422 with a second gas outlet 429.

Block 427 of the mid-connector 193 includes a cylindrical channel 433 for housing a gas inlet sleeve 431 therewithin the interior thereof. Sleeve 431 includes a channel 434 communicating with outlet 429 of gas passageway 422 through an aperture (not shown) in the cylindrical wall of sleeve 431. Sleeve 431 is housed within a cylindrical channel 433 of block 427 of mid-connector 19 via a bottom seal 435, a collar 437, a washer 439, and a nut 441, each of which has a central aperture for receiving at least threaded end 451 of shaft 197. Threaded end 451 of shaft 197 is threadedly engaged with nut 441. To secure the upper end of sleeve 431 within channel 433, an upper seal 435, an upper collar 443, and an upper washer 445 are provided.

Shaft 197 includes a shaft 452 having a threaded end 451 supporting an outer sleeve clamp 453. An inner sleeve clamp 455 is secured to the bottom of body 460 of mid-connector 195. Mid-connector 195 has a vertical cylindrical channel 459 extending therethrough and a top opening 457. This portion receives at least a portion of the top of shaft 197 such that arm segment 139 and arm assembly 201 are articulated or rendered pivotable about shaft 452. Mid-connector 195 also includes an integral cylinder 464 surrounded by a sleeve 463 and defining channel 466. Channel 466 connects to the mid-portion of arm assembly 201 and conveys a flow of gas from channel 466 to interior 203 of arm assembly 201. Interior 203 of the arm assembly 201 is defined by inner sleeve 469 and outer sleeve 467.

The cylindrical plug 473 of end plate 209 is disposed within sleeve 467 and attached through the drum clamp via apertures 476 and 478. End plate 209 also includes a partial cylindrical end 474 which is sized to be secured to the front of plug 473. Cylindrical end 474 supports a generally planar body 472 having a flat upper surface 475. The end plate contains a plurality of apertures 477 for receiving fasteners 495.

Body 472 includes a generally hollow cylindrical recess 479 therein. The recess is adapted to receive lower retainer bushing 481 therein. Bushing 481 includes a pair of outer apertures 483 adapted to receive screw fasteners therethrough and a central channel 485 which forms a vertical gas passageway for the assembly. A bearing 487 having a hollow interior 488 is housed over the end portion or annular flange of lower retainer bushing 481. The upper portion of the interior 488 of bearing 487 is adapted to receive an upper retainer bushing 491. Bushing 491 also includes a central gas channel 485 and a pair of fastener-receiving apertures 483 on either side of the channel. The top of retainer bushing 491 is adapted to be received within central aperture 497 of gear segment 215. The gear segment includes a body 496 having a plurality of gear teeth 498. A straight edge 600 and intersecting edge 602 form the other sides of gear segment 496. The gear segment is provided with a plurality of apertures 499 for receiving fasteners 495.

Mounting plate 211 includes a generally rectangular block-like member 494 having a first relatively thin, generally rectangular, rear part 493 and a second somewhat thicker, generally rectangular, front part 500. Threaded fasteners 523 extend through a plurality of apertures 507 in rear part 494 and apertures 497 of body 496 to engage apertures 483 of upper and lower bushings 491 and 483. A gas passage 511 (of which the exterior is shown) passes longitudinally through the rectangular rear part of mounting plate 211 for receiving the gas by communicating with central aperture 485 of upper bushing 491.

Passage 511 extends into front part 500 and then through a gas inlet 503 into a generally cylindrical cavity 501. Cavity 501, including a cylindrical wall 502, has a floor 504 which is provided with a plurality of interconnecting gas outlets 505. Threaded apertures 509 in floor 504 receive conventional threaded fasteners (not shown) passing through apertures 527 of cover plate 525 for closing the top of cavity 501. Gas inlet 503 is disposed a predetermined distance vertically above outlets 505, and a disk-like filter element 515 is placed on the bottom of the cavity to filter any gas passing through the cavity from inlet 503 to outlet 505. Above filter 515, a filter plunger 519 is disposed within cavity 501, and on top of the plunger is seated an O-ring seal 517 which fits about an annular collar portion of the plunger. Cover plate 525 is placed over top surface 512 of front part 500 to retain plunger 519 and filter 515 in place within cavity 501 while preventing escape of gas from the cavity. Outlets 505 of cavity 501 pass through bottom 510 and communicate with aperture 531 in a central portion of gasket 529, which gasket has a plurality of apertures 533 on the edge portions for receiving conventional fastener means. Bottom surface 532 of gasket 529 is adapted to be placed over the rear end of upper surface 296 of gas distribution plate 293 to align apertures 533 with apertures 313 of the gas distribution plate and gas passage aperture 531 with gas inlet aperture 319 of the upper gas distribution plate.

Gas distribution plate 293 includes a generally planar upper surface 296 and a relatively planar lower surface 333. The top surface includes aperture 319 proximate rear end 305. A plurality of apertures 313 are included on both rear edges for securing gas distribution plate 293 to bottom 510 of front part 500 of mounting plate 211 through apertures 533 of gasket 529.

The portions shown in dotted lines represent the array or pattern of gas distribution channels or grooves formed on lower surface 333 of gas distribution plate 293. The pattern of gas distribution grooves includes a first elongated longitudinal side groove 323, a second elongated longitudinal side groove 327 and a lateral groove 331 connecting the diverging ends of the side grooves. Side grooves 323, 337 and lateral groove 331 form an isosceles triangle having an apex terminating in a common reservoir or channel 329 communicating with aperture 319 in gas distribution plate 293. A central, elongated, longitudinal channel or groove 325 may be provided to bisect the isosceles triangle along lateral groove 331 at its mid-portion. The gas supplied to aperture 319 is distributed to each of grooves 323, 325 and 327 and therefrom to groove 331.

Gas outlet plate 295 includes a relatively planar upper surface 298 and a relatively planar lower surface 355. Apertures 341 proximate rear end 343 are adapted to be aligned with apertures 537 of retainer plate 539, forward apertures 313 of gas distribution plate 293, forward apertures 533 of gasket 529, and a forward pair of apertures 509 in front part 500 of mounting plate 211. Fastener means passed through these apertures secure gas distribution plate 293 and gas outlet plate 295 flush against one another in a sandwich-type configuration.

Upper surface 298 of gas outlet plate 295 includes a geometric pattern 601 for gas distribution. Each of the outlets is shown on upper surface 298 of gas outlet plate 295 as including a circular opening contained on or within a boundary of pattern 601. The pattern can be thought of as being similar to a four-sided geometric figure such as a truncated isosceles triangle. The base of the triangle can be thought of as existing between the imaginary intersections defined by points 611 and 613 and interconnected by a base 603 of triangle 610. The sides of the triangle can be thought of as terminating at rear end 343 of gas distribution plate 295. An imaginary line between gas outlets located on the opposed sides of the triangle define truncated top 605. The sides of triangle 610 coincide with the geometric pattern of grooves on lower surface 333 of gas distribution plate 293.

Side 607 of truncated triangular pattern 601 is connected between imaginary intersection point 613 and outlet 361 while opposite side 609 of truncated triangular pattern 601 is connected between imaginary intersection point 611 and outlet 366. This forms a truncated right isosceles triangle having base 603, truncated top 605, and pair of sides 607, 609.

A pattern of seven gas flow outlets are located or disposed on the border defining the truncated triangle. A first outlet 361 is formed at the intersection of side 607 with top 605 and outlet 366 is formed at the opposite end of top 605. A third gas outlet 362 is disposed on side 607 closer to imaginary intersection 613 than to outlet 361. A fourth gas outlet 365 is disposed on side 609 closer to imaginary intersection 611 than to outlet 366. A fifth outlet 363 is formed on base 603 between the imaginary intersection 613 and the longitudinal axis of wand assembly 43. Equally spaced on the opposite sides of the longitudinal axis is a sixth gas outlet 364 located approximately in the middle between the longitudinal axis and imaginary intersection 611. Lastly, a seventh gas flow outlet 367 is disposed on the longitudinal axis at the midpoint of top 605.

Each of outlets 361, 362, 363, 364, 365, 366 and 367 communicates with a corresponding gas flow outlet on lower surface 355 of gas outlet plate 295, and each is interconnected therewith through a slanted or tapered immediate channel portion. The tapered channel connecting the laterally displaced upper and lower outlets enables the seven gas flow outlets located on the periphery of pattern 601 to direct the gas flow substantially radially outwardly from a central portion of the pattern so that the gas flow is directed substantially radially outwardly across the top surface of wafer 81 to be picked up and to provide the necessary conditions to effect application of the Bernoulli Principle. The gas flow across the top surface of the wafer creates or establishes an area, volume, or zone of relatively low pressure between lower surface 355 of gas outlet plate 295 and the top surface of wafer 81 with respect to the pressure existing at the bottom surface of the wafer. This pressure differential serves to lift the wafer without any physical contact whatsoever between wand assembly 43 and the top or bottom surfaces of wafer 81.

Furthermore, this pattern provides a continuous outwardly sweeping flow of gas across the top surface of the wafer which greatly reduces the number of particles or contaminants which can collect thereon. Some very slight, soft contact can occur between two spaced apart areas on the outer peripheral rim of wafer 81 and a pair of depending locators 543. Locators 543 are disposed on the rear end of lower surface 355 of gas outlet plate 295 adjacent sides 345 and 347 thereof. An important function of the array of gas outlets is to bias the gas flow to draw the wafer slowly rearwardly under gas outlet plate 295 until the wafer's outer peripheral edge make soft contact with front sides 542 of locators 543. This soft gentle contact is not between the top surface of the wafer and the bottom surface of gas outlet plate 295, but only with two small areas on the outer peripheral circumference of the wafer and locators 543. The above-mentioned rearward horizontal bias results from the orientation of the gas outlets in the pattern in which only two of the seven outlets are radially outwardly directed in a forward direction whereas five of the seven outlets are radially outwardly directed in a rearward direction. This creates a horizontal component of force tending to urge the picked-up wafer rearwardly until it makes soft contact with locators 543.

When lower surface 333 of gas distribution plate 293 is placed over and flush against upper surface 298 of gas outlet plate 295, all of outlets 361, 362, 363, 364, 365, 366 and 367 are operatively disposed directly beneath the pattern of grooves 323, 325, 327 and 331 formed on lower surface 333 of gas distribution plate 393 for supplying a flow of gas thereto.

Additionally, a central outlet 368, which is supplied with gas from central longitudinal groove 325 in lower surface 333 of gas distribution plate 293, is located approximately in the center of the geometric pattern along the longitudinal axis of gas outlet plate 295 and is, contrary to the other gas outlets, disposed at a 90° angle straight through the gas outlet plate. The flow of gas from this outlet serves to aid in substantially reducing or eliminating turbulence, rapid vertical oscillations or wafer dribbling, and in substantially totally eliminating the pickup of contaminant particles which would otherwise result from a "vacuuming effect."

Lower retainer plate 539 is disposed beneath lower surface 355 of gas distribution plate 293 and apertures 537 are aligned with apertures 341 of gas outlet plate 295, apertures 313 of the gas distribution plate, apertures 533 of upper retainer plate 529 and the apertures in lower surface of front part 500 of mounting plate 211. Conventional fasteners secure these elements securely together in a sandwich-like manner. Tape 535 with corresponding aperture 538 insures a firm contact between upper surface 536 to lower surface 355. Fasteners, not shown, pass upwardly through the assembly and screw into the bottom of mounting plate 211. The removal of a few fasteners enables one wand assembly for use with a wafer of a first diameter to be easily interchanged with another wand assembly for use with a wafer of another diameter.

FIG. 12 shows lower surface 333 of gas distribution plate 293. Aperture 319 communicates with inlet 317, which inlet communicates via outlet 321 with the commonly connected ends of the grooves. The commonly connected or overlapping ends of the grooves form channel 329 (discussed above) and the gas from outlet 321 passes into the channel from whence it is fed into and along each of the plurality of grooves.

FIG. 13 shows a sectional end view of lower surface 333 of gas distribution plate 293. The gas distribution plate includes a single, integral, substantially flat member 301 of fused quartz and has a relatively planar top surface 302 and a relatively planar lower surface 333. Sides 303 and 304 represent the sides between which the section is taken, to illustrate the cross section of grooves 323, 325 and 327.

FIG. 14 shows a longitudinal cross section of the gas distribution plate 293. Rear end 305 is disposed across the longitudinal axis which terminates at front end 311. The front end includes a relatively planar front edge 337 of flat lower surface 333, a tapered top surface 335, and a pointed tip 339. Aperture 319 can be seen as being operatively disposed in upper surface 296 of gas distribution plate 293 proximate rear end 305. Outlet 321 communicates with aperture 319 through channel 329. The present section is taken through groove 325. At the end of the central longitudinal groove 325, the intersection with lateral groove 331 is shown.

FIG. 15 shows a top view of gas outlet plate 295. The gas outlet plate includes an upper surface 298, a relatively curved rear end 343, a pair of relatively straight sides 345 and 347, a pair of relatively straight front ends 349 and 351, and a curved central front edge 353. Upper surface 298 of gas outlet plate 295 is relatively planar and includes only a plurality of outlets 361, 362, 363, 364, 365, 366 and 367. These seven outlets define pattern 601 while the common relief outlet 368 is disposed in a central portion of the pattern for use as previously described. Upper surface 298 better illustrates the slope, taper or slant of the gas outlets and it will be noted that the flow is generally radially outward from the approximate center of pattern 601 so as to provide a continuous outwardly sweeping air flow for keeping particles off the top surface of the wafer while simultaneously providing the area of decreased pressure for enabling the Bernoulli Principle to be used to lift or pick up the wafer without physical contact. Since five of the seven outlets are directed horizontally rearward, the wafer is slowly urged horizontally rearwardly until it abuts locators 543.

FIGS. 16 and 17 illustrate the slanted channels described with respect to FIG. 15. The apertures are shown as having a circular inlet 371 on upper surface 298 of gas outlet plate 295, a circular outlet 375 on lower surface 355 and a sloped interconnecting channel 373. Similarly, the oppositely sloped gas outlets shown in FIG. 17 can be considered as having a circular inlet 377 in upper surface 298, a circular outlet 381 in lower surface 355 and a sloped, slanted or tapered interconnecting channel 379. The particular slope and orientation of the channel will determine the direction of gas flow from lower surface 355 of gas outlet plate 295 and hence can provide the desired substantially radially outward flow for maximizing the efficiency of the pickup operation while simultaneously minimizing particular contamination.

Figure 18:
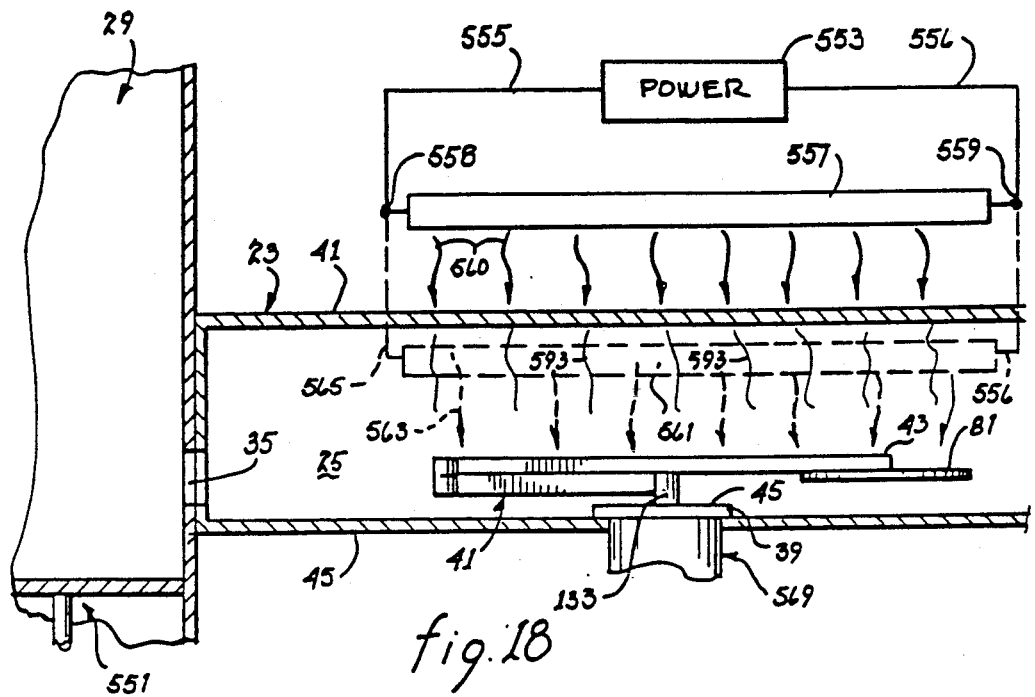
FIG. 18 is a partial sectional side view showing an apparatus for further reducing particle contamination.
Figure 19:
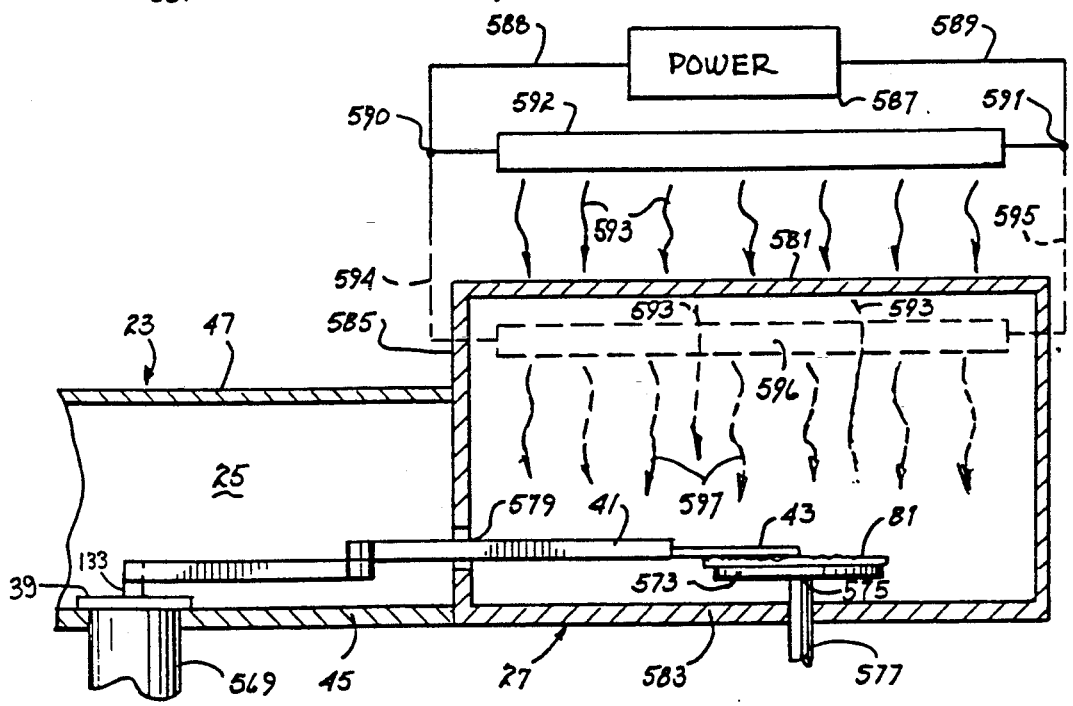
FIG. 19 is a partial sectional side view showing apparatus for particle elimination.

FIGS. 18 and 19 illustrate yet another embodiment of the wafer handling system shown in FIG. 1 and add additional means for reducing particular contaminants in the system. Enclosure 23 includes a top surface 47 and a floor 45 and a hollow interior 25.

As previously described, a portion of the drive assembly, such as gear housing 569, is coupled through a vacuum seal to plate assembly 39 which serves to drive a pair of articulated robot arms 41 having a pick-up wand assembly 43 mounted at the front end thereof for picking up and carrying a semiconductor wafer 81. The rear ends of the articulated robot arms 41 are coupled to shaft 133 extending through floor 45 and plate assembly 39. A supply station, supply port or purge box (29) includes an elevator 551 for carrying a cassette holding a plurality of wafers (not shown) in a horizontal position. Elevator 551 moves vertically in a step-wise linear manner to accurately position a wafer at access slot 35 through which the robot arms pass to pick up a wafer contained in the cassettes for delivery to reactor 27.

In the embodiment shown in FIG. 18, a source 557 of ultraviolet (UV) infrared rays 560 is provided. The source may be any conventional tube or other source of ultraviolet rays chosen to radiate in the desired spectral range such that the UV rays pass readily through top surface 47; the top surface is preferably made of fused quartz which is transparent to UV radiation at the radiating wavelength. Source 557 is provided exterior of the top surface and UV rays 560 pass through the quartz and bombard the central area in interior 25 to continually irradiate robot arms 41, wafer pick-up wand assembly 43 and the top surface of the wafer 81 carried thereby whenever the robot arms are in the home position. Since the plates of the pick-up wand assembly are also made of quartz, the UV rays pass readily therethrough to bombard the top surface of the transported wafer and the area thereabove. Bombardment with ultraviolet rays 560 neutralizes the charge of contaminant particles within interior 25 of enclosure 23. By removing the charge, the particles are less likely to interact with, stick to, be attracted to or accumulate on the top surface of wafer 81. Thus, bombardment with ultraviolet rays reduces particle contamination and further improves cleanliness of the wafer handling system.

The UV source 557 is shown as having one terminal connected to a node 558 which in turn is connected via lead 555 to one output of a power source 553. The power source is also connected through a lead 556 to a second node 559. Node 559 connects to the opposite end terminal of tube 557 to supply power to the tube for generating the ultraviolet rays 560.

Alternatively, a tube 561 can be placed within interior 25 of enclosure 23 adjacent top surface 47. The ultraviolet rays 563 perform the bombardment necessary for neutralizing charged particles which might otherwise contaminate wafer 81. Tube 561 is supplied power via lead 565 coupled between one end terminal of the tube 561 and node 558, while node 559 is coupled via lead 556 to the opposite end terminal of the tube 561.

FIG. 19 provides another embodiment of the concept shown in FIG. 18. Enclosure 23 includes upper surface 47, which may be a quartz panel, and a floor 45. Gear housing 569 is connected through a vacuum seal from beneath the surface of floor 45 to interior rotatable plate assembly 39. The shaft 133 couples the gear housing with the rear end of a pair of articulated robot arms 41 to extend and retract them. Pick-up wand assembly 43 is shown as depositing wafer 81 onto a rotatable susceptor 573 mounted on a pedestal 575 having a rotatable shaft 577. The assembly, including susceptor 573, pedestal 575 and shaft 577, may be upwardly and downwardly positionable and rotatable, as desired. Robot arms 41 are in the fully extended position and to pass through gate 579 communicating with interior 571 of reactor 27. Top 581 and bottom 583 of reactor 27 are made from quartz to be transparent to ultraviolet radiation of a particular wavelength or range of wavelengths.

A source of UV radiation, tube 592, is operatively mounted or disposed on the exterior of top 581 and arranged to irradiate the interior proximate the entrance or between the gate and the susceptor of the reactor 27 to neutralize charged particle contaminants adjacent access gate 579 and within the reactor. Tube 592 receives power from a power source 587 and connected through a first lead 588 and a node 590 to one terminal of tube 592. The power source is also connected through a lead 589 to a node 591 and then to the other terminal of the tube.

In an alternate embodiment, the UV source or tube 596 is operatively mounted or disposed within the interior 571 of reactor 27 adjacent top 581. Tube 596 produces UV radiation (rays 597) for bombarding the path of wafer 81 from access gate 579 to susceptor 573 to neutralize charged particles and prevent them from accumulating on the wafer surface. Tube 596 has one terminal connected via lead 594 to input node 590, and its opposite terminal connected via lead 595 to input node 591 to obtain power from power source 587.

In the preferred embodiment of the present invention, the pair of articulated robot arms are much stronger and more accurately positionable than was heretofore possible by constructing them of stainless steel and providing them with a circular cross section. The length of the robot arms at their fully extended position is significantly longer than the 18 inches normally possible and lengths of at least 25 inches are routine.

Both gas distribution plate 293 and gas outlet plate 295 of pick-up wand assembly 43 are manufactured from fused quartz and acid-etched and polished with an acid such as hydrofluoric acid. The etching and polishing not only smooths and polishes the grooves and apertures formed in the plates to prevent particles from being deposited thereon, but also polishes all the surfaces to prevent particles from being attracted to or accumulating on the surfaces and therefore reduce the chance of contaminating or damaging the wafer. The use of quartz for the wafer pick up wand assembly enables it to be used to pick up relatively hot substrates. Normal processing in the reaction chamber raises the wafer temperature to approximately 1150° C. The temperature cools down to below 1000° C. in about one minute. A very short time later, when the wafer temperature is lowered to 800° C.–900° C., the pick up wand assembly can lift the hot wafer without damage thereto.

The walls of enclosure 23 are preferably made of a noncontaminating material such as anodized aluminum or the like and a window, preferably made of an ultraviolet-transparent material, such as fused quartz, is provided therein for observation purposes. The interiors of the robot arms include a continuous gas passage therethrough so that gas is supplied from an external source through the robot arms to the gas distribution plate 293. The gas used is dependent upon the operation to be effected; in epitaxial deposition system, the gas will be either hydrogen or nitrogen, depending upon the particular operation then being conducted. Gas can be supplied from any conventional gas container or source.

The present invention provides three distinct but related advantages. The first advantage is to provide a wafer pick up and delivery apparatus for use in a high speed, continuous, single wafer processing system which apparatus will not damage the wafer. The second advantage is to provide every possible means of reducing or eliminating particular contaminants to the other of two or three particles per wafer. The third advantage is to provide for a "hot" pick up wherein processed wafers can be picked up within a few minutes after processing.

A typical operation of the present invention may be summarized as follows. Robot arms 41 are normally maintained in the home position. To pick up a wafer from station 29, plate assembly 39 rotates until pick up wand assembly 43 faces access slot 35 of the station; the robot arms are maintained in the home position during rotation. Once the rotation stops, robot arms 41 are extended to pass the pick up wand assembly through the access slot and to a cassette for picking up a wafer and translating motion is stopped. The wafer is picked up when the flow of gas is commenced after the robot arms are stationary above the wafer to be lifted. After pick up, the robot arms are retracted to the home position and held in that position while the plate rotates to position the pick up wand assembly in alignment with the entrance to reactor 27. The robot arms are extended to position the wafer on the susceptor therein and the flow of gas is stopped resulting in release of the wafer and deposit of the wafer on the susceptor. The robot arms are withdrawn to the home position while the wafer is processed. The robot arms are extended back into the reactor to pick up the processed wafer while it is still hot. To lift the wafer, the flow of gas is initiated; after the wafer is picked up, the robot arms retract to the home position. Plate assembly 39 is rotated until the loaded pick up wand assembly is positioned in front of the access slot to a station. To deposit the wafer within a cassette housed in the station, the robot arms are extended. Terminating the flow of gas will release the wafer upon the cassette. In the final step, the robot arms retract to the home position to position them ready for a further cycle. It may be noted that the flow of gas is intermittent to minimize turbulence of particulate matter.

What I claim is:

1. A wafer handling system for picking up a wafer at a first location and delivering the wafer to a second location, which wafer includes a top surface, a bottom surface and a perimeter, said wafer handling system comprising in combination:
    a) an enclosure in communication with the first and second locations;
    b) a source of gas;
    c) a pair of articulated robot arms in fluid communication with said source of gas for conveying a flow of gas therethrough, each of said pair of arms having a first end portion and a second end portion;
    d) a pick-up wand assembly supported by said second end portion of each arm of said pair of robot arms, said wand assembly including means for receiving a flow of gas from said pair of robot arms and for picking of the wafer from above the top surface of the wafer without physically contacting the top or bottom surfaces of the wafer with said wand assembly;
    e) said wand assembly comprising:
        i) a plate having a generally planer lower surface;
        ii) at least one first outlet disposed in the surface of said plate for establishing an omnidirectional flow of gas across the wafer upon retention of the wafer, said at least one first outlet being oriented essentially normal to the surface of said plate;
        iii) a plurality of second outlets disposed in the surface of said plate for establishing a plurality of streams of gas flow toward one segment of the perimeter of the wafer upon retention of the wafer and for channeling the gas flow from said at least one first outlet intermediate the plurality of streams of gas flow from said second outlets;
        iv) a plurality of third outlets disposed in the surface of said plate for establishing a plurality of streams of gas flow toward another segment of the perimeter of the wafer upon retention of the wafer and for channeling the gas flow from said at least one first outlet intermediate the plurality of streams of gas flow from said third outlets;
        v) one of said plurality of second and third outlets including at least one outlet oriented generally toward said pair of robot arms and one of said plurality of second and third outlets including at least one outlet oriented generally away from said pair of robot arms;
        vi) means disposed within said wand assembly for channeling the flow of gas in said receiving means through said at least one first outlet, said second plurality of outlets and said third plurality of outlets; and
        vii) means on said wand assembly for limiting the movement of a retained wafer past said limiting means;
    f) means for mounting said first end portion of said robot arms to impart motion to said pair of robot arms; and
    g) drive means coupled to said mounting means for retracting, extending and rotating said pair of robot arms to pick up and deliver the wafer from the first location to the second location.

2. A wafer handling system for use in a semiconductor wafer processing system including at least a first enclosure for at least temporarily housing a plurality of wafers to be processed, a second enclosure for processing the wafers, a third enclosure for at least temporarily receiving the processed wafers, and a fourth enclosure for housing at least a portion of said wafer handling system, the fourth enclosure being in communication with the first, second, and third enclosures, said wafer handling system being operatively positioned within the fourth enclosure for picking up one of the wafers from of the first, second and third enclosures and for transporting and depositing the wafer in a different one of the first, second and third enclosures, said wafer handling system comprising in combination:
    a) a pair of robot arms, each arms of said pair of robot arms having a rear end portion, a front end portion and an elongated intermediate portion therebetween, each arm of said pair of robot arms including means for forming a continuous gas passage there through;
    b) means for mounting said rear end portions of said pair of robot arms to longitudinally extend, retract and rotate said pair of robot arms;
    c) a source of gas;
    d) means for supplying a flow of gas from said source of gas to said rear end portion of said pair of robot arms and into said continuous gas passage;
    e) a wand assembly including a relatively flat pick-up wand unit, means for removably mounting said wand unit to said front end portion of said pair of robot arms, said wand assembly further including means for supplying a flow of gas from said continuous gas passage to said wand unit; and
    f) said wand unit including:
        i) a plate having a generally planar lower surface;
        ii) at least one first outlet disposed in the surface of said plate for establishing an omnidirectional flow of gas across the wafer upon retention of the wafer, said at least one first outlet being oriented essentially normal to the surface of said plate;
        iii) a plurality of second outlets disposed in the surface of said plate for establishing a plurality of streams of gas flow toward one segment of the perimeter of the wafer upon retention of the wafer and for channeling the gas flow from said at least one first outlet intermediate the plurality of streams of gas flow from said second outlets;

iv) a plurality of third outlets disposed in the surface of said plate for establishing a plurality of streams of gas flow toward another segment of the perimeter of the wafer upon retention of the wafer and for channeling the gas flow from said at least one first outlet intermediate the plurality of streams of gas flow from said third outlets;

v) one of said plurality of second and third outlets including at least one outlet oriented generally toward said pair of robot arms and one of said plurality of second and third outlets including at least one outlet oriented generally away from said pair of robot arms;

vi) means disposed within said plate for channeling the flow of gas in said wand unit through said at least one first outlet, said second outlets and said third outlets; and vii) means on said wand unit for limiting the movement of a retained wafer past said limiting means.

3. In a semiconductor wafer processing system including at least a first enclosure for temporarily storing at least one wafer to be processed, a second enclosure for processing a wafer, a third enclosure communicating with the first and second enclosures, a pair of elongated robot arms having a rear end portion and a front end portion and operatively disposed within the third enclosure, means operatively coupled to the rear end portion of each arm of the pair of robot arms for extending and retracting the pair of robot arms and for rotating the pair of robot arms to reposition the wafer from the first enclosure to the second enclosure and a pick-up wand operatively mounted on the front end portion of the pair of robot arms for picking up and carrying the wafer, the improvement comprising in combination:

a) a source of gas under pressure;
b) a hollow conduit extending from the rear end portion to the front end portion and longitudinally through each arm of the pair of robot arms;
c) means for operatively coupling said source of gas with each of said hollow conduits adjacent the rear end portions of the pair of robot arms;
d) means for supplying gas from each of said hollow conduits at the front end portion of the pair of robot arms to the pick-up wand;
e) means for mounting the pick-up wand on the front end portion of the pair of robot arms;
f) the pick-up wand comprising:
  i) a plate having a generally planar lower surface;
  ii) at least one first outlet disposed in the surface of said plate for establishing an omnidirectional flow of gas across the wafer upon retention of the wafer, said at least one first outlet being oriented essentially normal to the surface of said plate;
  iii) a plurality of second outlets disposed in the surface of said plate for establishing a plurality of streams of gas flow toward one segment of the perimeter of the wafer upon retention of the wafer and for channeling the gas flow from said at least one first outlet intermediate the plurality of streams of gas flow from said second outlets;
  iv) a plurality of third of outlets disposed in the surface of said plate for establishing a plurality of streams of gas flow toward another segment of the perimeter of the wafer upon retention of the wafer and for channeling the gas flow from said at least one first outlet intermediate the plurality of streams of gas flow from said third outlets;
  v) one of said plurality of second and third outlets including at least one outlet oriented generally toward said pair of robot arms and one of said plurality of second and third outlets including at least one outlet oriented generally away from said pair of robot arms;
  vi) means disposed within said plate for channeling the gas supplied to the pick-up wand through said at least one first outlet, said second outlets and said third outlets; and
  vii) means on the pick-up wand for limiting the movement of a retained wafer past said limiting means.

4. In a semiconductor processing system including a first enclosure means for at least temporarily storing a plurality of wafers to be processed, each of which wafers includes a perimeter, a second enclosure means for forming at least one process step on a wafer, a third enclosure means for at least temporarily storing a plurality of processed wafers, a fourth enclosure means in communication with the first, second and third enclosure means, a pair of robot arms having front end portions and having rear end portions mounted for movement within the fourth enclosure means, drive means for extending, retracting and rotatably positioning the pair of robot arms between the respective front end portion and the rear end portion and a pick-up wand supported by the front end portion of the pair of robot arms, a method comprising the steps of:

a) supplying gas under pressure to the rear end portions of the pair of robot arms;
b) conducting the supplied gas through the hollow interior of each arm of the pair of robot arms;
c) feeding the conducted gas from the front end portions of the pair of robot arms to the pick-up wand;
d) defining a generally planar lower surface with a plate of the pick-up wand;
e) distributing the gas through interior passages of the pick-up wand;
f) establishing an omnidirectional flow of gas across the wafer upon retention of the wafer with at least one first outlet oriented essentially normal to the surface of the plate;
g) further establishing a plurality of streams of gas flow toward one segment of the perimeter of the wafer upon retention of the wafer through a plurality of second outlets disposed in the surface of the plate and channeling the gas flow from the at least one first outlet intermediate the plurality of streams of gas flow from the second outlets;
h) yet further establishing a plurality of streams of gas flow toward another segment of the perimeter of the wafer upon retention of the wafer through a plurality of third outlets disposed in the surface of the plate and channeling the gas flow from the at least one first outlet intermediate the plurality of streams of gas flow from the third outlets;
i) conveying a flow of gas from the hollow interior of the pick-up wand to each of the at least one first outlet, the second outlets and the third outlets;
j) directing a flow of gas from at least one outlet of the plurality of second and third outlets generally toward the front end portion of the pair of robot arms;

k) further directing a flow of gas from at least one outlet of the plurality of second and third outlets generally away from the front end portion of the pair of robot arms; and l) limiting movement of the retained wafer past a predetermined location attendant the pick-up wand.

5. In a wafer handling system including a pair of robot arms having front end portions, at least one arm of the robot arms being hollow, means for extending, retracting and rotating the pair of robot arms, and a pick-up wand having interior passages, a surface defined by a plate and carried by the pair of robot arms, a method for handling a wafer comprising the steps of:

a) supplying gas under pressure through at least one hollow arm of the pair of robot arms to the interior passages in the pick-up wand;

b) defining a generally planar lower surface with a plate of the pick-up wand;

c) establishing an omnidirectional flow of gas across the wafer upon retention of the wafer with at least one first outlet oriented essentially normal to the surface of the plate;

d) further establishing a plurality of streams of gas flow toward one segment of the perimeter of the wafer upon retention of the wafer through a plurality of second second outlets disposed in the surface of the plate and channeling the gas flow from the at least one first outlet intermediate the plurality of streams of gas flow from the second outlets;

e) yet further establishing a plurality of streams of gas flow toward another segment of the perimeter of the wafer upon retention of the wafer through a plurality of third outlets disposed in the surface of the plate and channeling the gas flow from the at least one first outlet intermediate the plurality of streams of gas flow from the third outlets;

f) conveying a flow of gas from the interior passages of the pick-up wand to each of the at least one first outlet, the second outlets and the third outlets;

g) directing a flow of gas from at least one outlet of the plurality of second and third outlets generally toward the front end portions of the pair of robot arms;

h) further directing a flow of gas from at least one outlet of the plurality of second and third outlets generally away from the front end portions of the pair of robot arms; and i) limiting movement of the retained wafer past a predetermined location attendant the pick-up wand.

6. The method for handling a wafer set forth in claim 5 including the step of filtering the flow of gas to the pick-up wand for removing particles from the gas.

7. A wafer pick-up assembly comprising:

a) a pair of elongated robot arms, each arm of said pair of robot arms having a front end portion, a rear end portion and at least one arm having a continuous conduct extending from said rear end portion to said front end portion;

b) means operatively coupled to said rear end portion of each arm of said pair of robot arms for extending, retracting and rotatably positioning said pair of robot arms;

c) a pick-up wand operatively carried by said front end portion of each arm of said pair of robot arms for picking up a wafer, said pick-up wand including a gas reservoir;

d) means for supplying gas to said rear end portion of at least one arm of said pair of robot arms to channel gas through said continuous conduit;

e) means for supplying the gas from said front end portion of at least one arm of said pair of robot arms to said gas reservoir of said pick-up wand;

f) said wand assembly comprising:

i) a plate having a generally planar lower surface;

ii) at least one first outlet in fluid communication with said gas reservoir and disposed in the surface of said plate for establishing an omnidirectional flow of gas across the wafer upon retention of the wafer, said at least one first outlet being oriented essentially normal to the surface of said plate;

iii) a plurality of second outlets in fluid communication with said gas reservoir and disposed in the surface of said plate for establishing a plurality of streams of gas flow toward one segment of the perimeter of the wafer upon retention of the wafer and for channeling the gas flow from said at least one first outlet intermediate the plurality of streams of gas flow from said second outlets;

iv) a plurality of third outlets in fluid communication with said gas reservoir and disposed in the surface of said plate for establishing a plurality of streams of gas flow toward another segment of the perimeter of the wafer upon retention of the wafer and for channeling the gas flow from said at least one first outlet intermediate the plurality of streams of gas flow from said third outlets;

v) one of said plurality of second and third outlets including at least one outlet oriented generally toward said pair of robot arms and one of said plurality of second and third outlets including at least one outlet oriented generally away from said pair of robot arms;

vi) means disposed within said plate for channeling the gas from said gas reservoir through said at least one first outlet, said second outlets and said third outlets; and vii) means on said pick-up wand for limiting the movement of a retained wafer past said limiting means.

8. A wafer handling apparatus for transporting a wafer having upper and lower planar surfaces from a first location to a second location, said apparatus comprising in combination:

a) a wand assembly for discharging a plurality of streams of gas to engage the wafer at the first location without contacting the upper or lower planar surfaces of the wafer and to disengage the wafer at the second location, said wand assembly including a rear end portion;

b) said wand assembly comprising:

i) a plate having a generally planar lower surface;

ii) at least one first outlet disposed in the surface of said plate for establishing an omnidirectional flow of gas across the wafer upon retention of the wafer, said at least one first outlet being oriented essentially normal to the surface of said plate;

iii) a plurality of second outlets disposed in the surface of said plate for establishing a plurality of streams of gas flow toward one segment of the wafer upon retention of the wafer and for channeling the gas flow from said at least one first outlet intermediate the plurality of streams of gas flow from said second outlets;

iv) a plurality of third outlets disposed in the surface of said plate for establishing a plurality of streams of gas flow toward another segment of the wafer upon retention of the wafer and for channeling the gas flow from said at least one first outlet intermediate the plurality of streams of gas flow from said third outlets;

v) one of said plurality of second and third outlets including at least one outlet oriented generally toward said rear end portion and one of said plurality of second and third outlets including at least one outlet oriented generally away from said rear end portion;

vi) means disposed within said plate for channeling the gas through said at least one first outlet, said second plurality of outlets and said third plurality of outlets; and vii) means on said wand assembly for limiting the movement of a retained wafer past said limiting means;

c) means for controlling the flow of the gas through said at least one first outlet and each of said second and third outlets; and d) means for transporting said wand assembly from the first location to the second location.

9. A wafer transport apparatus having at least one arm for transporting a wafer from one location to another and a wand assembly supported by the at least one arm for releasably retaining the wafer in response to an outflow of gas received through the at least one arm from a source of gas, said wand assembly comprising in combination:

a) a plate having a generally planar lower surface;

b) at least one first outlet disposed in the surface of said plate for establishing an omnidirectional flow of gas across the wafer upon retention of the wafer, said at least one first outlet being oriented essentially normal to the surface of said plate;

c) a plurality of second outlets disposed in the surface of said plate for establishing a plurality of streams of gas flow toward one segment of the wafer upon retention of the wafer and for channeling the gas flow from said at least one first outlet intermediate the plurality of streams of gas flow from said second outlets;

d) a plurality of third outlets disposed in the surface of said plate for establishing a plurality of streams of gas flow toward another segment of the wafer upon retention of the wafer and for channeling the gas flow from said at least one first outlet intermediate the plurality of streams of gas flow from said third outlets;

e) one of said plurality of second and third outlets including at least one outlet oriented generally toward the at least one arm and one of said plurality of second and third outlets including at least one outlet oriented generally away from the at least one arm;

f) means disposed within said plate for channeling the gas received from the at least one arm through said at least one first outlet, said second outlets and said third outlets; and g) means on said wand assembly for limiting the movement of a retained wafer past said limiting means.

10. The apparatus as set forth in claim 9 wherein each of said plurality of second and third outlets includes a greater number of outlets oriented generally toward the at least one arm than the number of outlets oriented generally away from the at least one arm.

11. The apparatus as set forth in claim 9 wherein said channeling means includes a plurality of interconnecting passageways disposed in said wand assembly for interconnecting each of said at least one first outlet and said second and third outlets with the outflow of gas from the at least one arm.

12. A wafer transport apparatus including a source of gas and operating in accordance with Bernoulli's principle, said apparatus comprising in combination:

a) at least one arm for transporting a wafer from one location to another, said at least one arm including means for conveying a flow of gas from the source of gas;

b) a wand assembly supported upon said at least one arm for releasably retaining the wafer to be transported and for receiving a flow of gas from said at least one arm;

c) a plate attached to said wand assembly for defining a generally planar lower surface of said wand assembly;

d) a first plurality of outlets disposed in the bottom surface of said plate for exhausting the gas received by said wand assembly and for establishing a plurality of streams of gas flow toward one segment of the wafer upon retention of the wafer;

e) a second plurality of outlets disposed in the surface of said plate for exhausting the gas received by said wand assembly and for establishing a plurality of streams of gas flow toward another segment of the wafer upon retention of the wafer;

f) one of said first and said second plurality of outlets including at least one outlet oriented generally toward said at least one arm and one of said first and second plurality of outlets including at least one outlet oriented generally away from the at least one arm;

g) at least a third outlet disposed in the surface of said plate for exhausting the gas received by said wand assembly and for establishing a flow of gas intermediate the plurality of streams of gas flow emanating from said first and second plurality of outlets upon retention of the wafer; and h) means depending below said plate surface for limiting the movement of a retained wafer past said limiting means.

13. The apparatus as set forth in claim 12 wherein at least one of said first and second plurality of outlets include a greater number of said outlets having a component of gas flow toward said limiting means than the number of said outlets having a component of gas flow away from said limiting means.

14. The apparatus as set forth in claim 12 including a plurality of interconnecting passageways disposed in said wand assembly for interconnecting each of said first and second plurality of outlets and said at least one third outlet with the outflow of gas from said at least one arm.

15. The apparatus as set forth in claim 12 wherein said limiting means extends from said plate.

* * * * *